US008859984B2

(12) United States Patent
Noji et al.

(10) Patent No.: US 8,859,984 B2
(45) Date of Patent: Oct. 14, 2014

(54) METHOD AND APPARATUS FOR INSPECTING SAMPLE SURFACE

(71) Applicants: Nobuharu Noji, Ohta-ku (JP); Yoshihiko Naito, Ohta-ku (JP); Hirosi Sobukawa, Ohta-ku (JP); Kenji Terao, Ohta-ku (JP); Masahiro Hatakeyama, Ohta-ku (JP); Katsuya Okumura, Shinjuku-ku (JP)

(72) Inventors: Nobuharu Noji, Ohta-ku (JP); Yoshihiko Naito, Ohta-ku (JP); Hirosi Sobukawa, Ohta-ku (JP); Kenji Terao, Ohta-ku (JP); Masahiro Hatakeyama, Ohta-ku (JP); Katsuya Okumura, Shinjuku-ku (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 13/954,425

(22) Filed: Jul. 30, 2013

(65) Prior Publication Data

US 2013/0313429 A1    Nov. 28, 2013

Related U.S. Application Data

(62) Division of application No. 13/398,112, filed on Feb. 16, 2012, now Pat. No. 8,525,127, which is a division of application No. 12/162,067, filed as application No. PCT/JP2007/051047 on Jan. 24, 2007, now abandoned.

(30) Foreign Application Priority Data

Jan. 25, 2006   (JP) .................................. 2006-016519
Mar. 6, 2006    (JP) .................................. 2006-058847
Mar. 6, 2006    (JP) .................................. 2006-058862

(51) Int. Cl.
*G01N 23/00*    (2006.01)

(52) U.S. Cl.
USPC ........... 250/397; 250/306; 250/307; 250/310; 250/311; 250/492.2

(58) Field of Classification Search
USPC .............. 250/306, 307, 310, 311, 397, 492.2, 250/207
See application file for complete search history.

(56) References Cited

U.S. PATENT DOCUMENTS 4,554,455 A * 11/1985 Todokoro et al. ............. 250/305
4,605,860 A    8/1986 Fukuhara et al.
(Continued)

FOREIGN PATENT DOCUMENTS

EP    1304717 A1    4/2003
JP    10-125271 A   5/1998
(Continued)

OTHER PUBLICATIONS

International Search Report of PCT/JP2007/051047, date of mailing Apr. 10, 2007.

*Primary Examiner* — Michael Logie
(74) *Attorney, Agent, or Firm* — Westerman, Hattori, Daniels & Adrian, LLP

(57) ABSTRACT

Provided is a method and an apparatus for inspecting a sample surface with high accuracy. Provided is a method for inspecting a sample surface by using an electron beam method sample surface inspection apparatus, in which an electron beam generated by an electron gun of the electron beam method sample surface inspection apparatus is irradiated onto the sample surface, and secondary electrons emanating from the sample surface are formed into an image toward an electron detection plane of a detector for inspecting the sample surface, the method characterized in that a condition for forming the secondary electrons into an image on a detection plane of the detector is controlled such that a potential in the sample surface varies in dependence on an amount of the electron beam irradiated onto the sample surface.

12 Claims, 14 Drawing Sheets

(56) References Cited

U.S. PATENT DOCUMENTS

| | | | |
|---|---|---|---|
| 5,430,292 A | 7/1995 | Honjo et al. | |
| 5,576,833 A | 11/1996 | Miyoshi et al. | |
| 6,172,363 B1 | 1/2001 | Shinada et al. | |
| 6,518,582 B1 | 2/2003 | Kohama | |
| 6,563,114 B1 | 5/2003 | Nagahama et al. | |
| 6,593,152 B2 * | 7/2003 | Nakasuji et al. | 438/14 |
| 6,734,429 B2 | 5/2004 | Takagi | |
| 6,838,667 B2 | 1/2005 | Tsuneta et al. | |
| 6,909,092 B2 | 6/2005 | Nagahama et al. | |
| 6,992,290 B2 | 1/2006 | Watanabe et al. | |
| 7,075,076 B2 | 7/2006 | Makino et al. | |
| 7,098,457 B2 * | 8/2006 | Nagahama et al. | 250/310 |
| 7,138,629 B2 | 11/2006 | Noji et al. | |
| 7,288,948 B2 | 10/2007 | Hasegawa et al. | |
| 7,365,324 B2 | 4/2008 | Noji et al. | |
| 7,417,236 B2 * | 8/2008 | Nakasuji et al. | 250/440.11 |
| 7,741,601 B2 | 6/2010 | Noji et al. | |
| 2002/0005484 A1 * | 1/2002 | Nishimura | 250/310 |
| 2002/0036264 A1 | 3/2002 | Nakasuji et al. | |
| 2002/0088940 A1 * | 7/2002 | Watanabe et al. | 250/310 |
| 2002/0171051 A1 | 11/2002 | Nakagaki et al. | |
| 2003/0006371 A1 | 1/2003 | Watanabe et al. | |
| 2003/0025904 A1 | 2/2003 | Sakai et al. | |
| 2003/0207475 A1 | 11/2003 | Nakasuji et al. | |
| 2004/0183013 A1 | 9/2004 | Nakasuji et al. | |
| 2004/0207414 A1 | 10/2004 | Verma et al. | |
| 2005/0040331 A1 | 2/2005 | Gunji et al. | |
| 2005/0194535 A1 | 9/2005 | Noji et al. | |
| 2005/0234672 A1 | 10/2005 | Takahashi et al. | |
| 2005/0263701 A1 * | 12/2005 | Nagahama et al. | 250/310 |
| 2006/0133661 A1 | 6/2006 | Takeda et al. | |
| 2006/0243906 A1 * | 11/2006 | Fukada et al. | 250/307 |
| 2007/0040118 A1 * | 2/2007 | Cheng et al. | 250/310 |
| 2007/0272860 A1 | 11/2007 | Takahashi et al. | |
| 2009/0050802 A1 * | 2/2009 | Noji et al. | 250/307 |
| 2010/0237243 A1 | 9/2010 | Noji et al. | |

FOREIGN PATENT DOCUMENTS

| | | | |
|---|---|---|---|
| JP | 2000-299361 A | 10/2000 | |
| JP | 2002-33068 A | 1/2002 | |
| JP | 2002-118158 A | 4/2002 | |
| JP | 2002-134048 A | 5/2002 | |
| JP | 2003-303568 A | 10/2003 | |
| JP | 2004-363085 A | 12/2004 | |
| JP | 2005-129546 A | 5/2005 | |
| JP | 2005-302906 A | 10/2005 | |
| WO | 02/13227 A1 | 2/2002 | |
| WO | 02-056332 A1 | 7/2002 | |
| WO | 2004/068529 A2 | 8/2004 | |
| WO | WO 2004068529 A2 * | 8/2004 | H01J 37/244 |

* cited by examiner

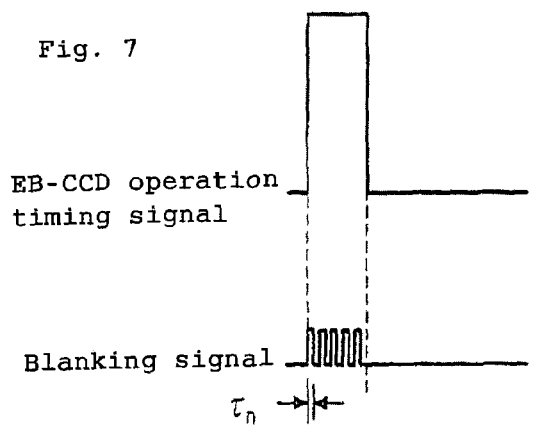
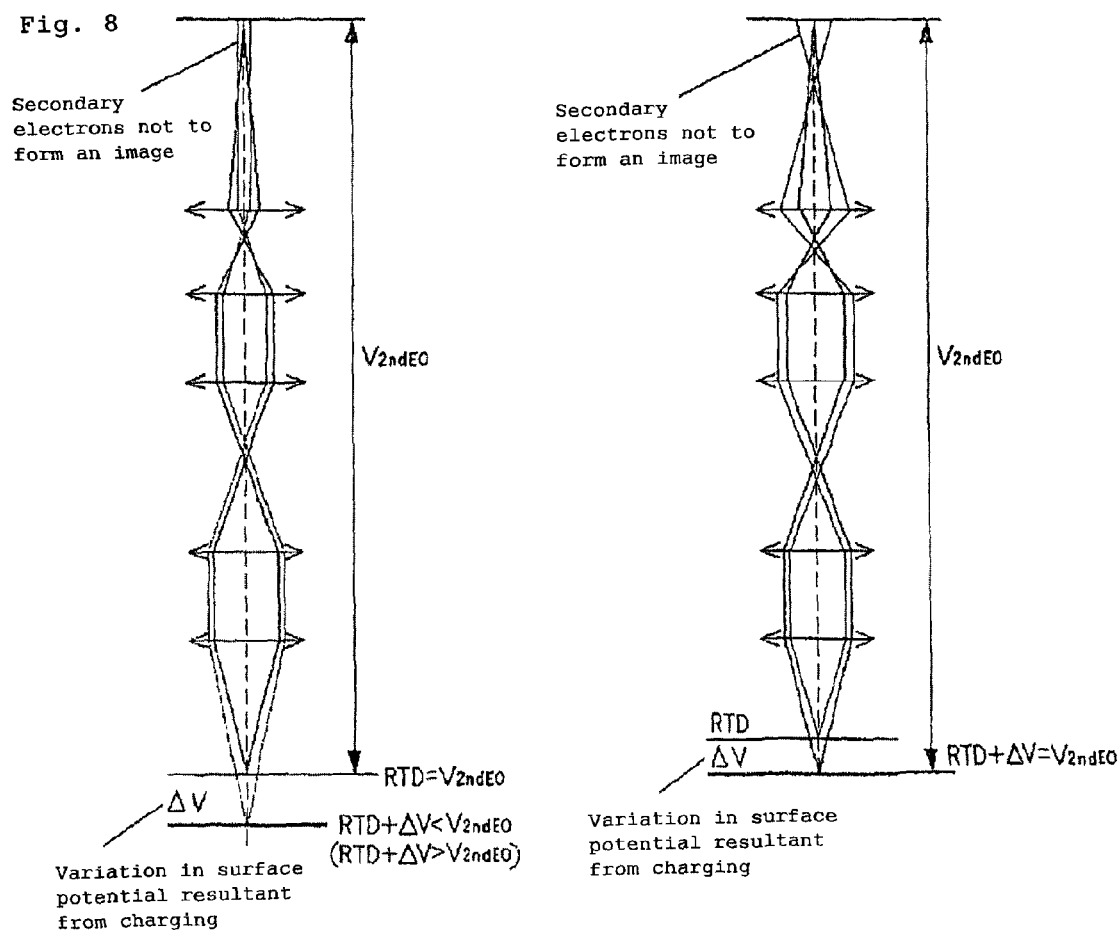

Overlay mark to be inspected bar in bar    bar in box

Overlay pattern

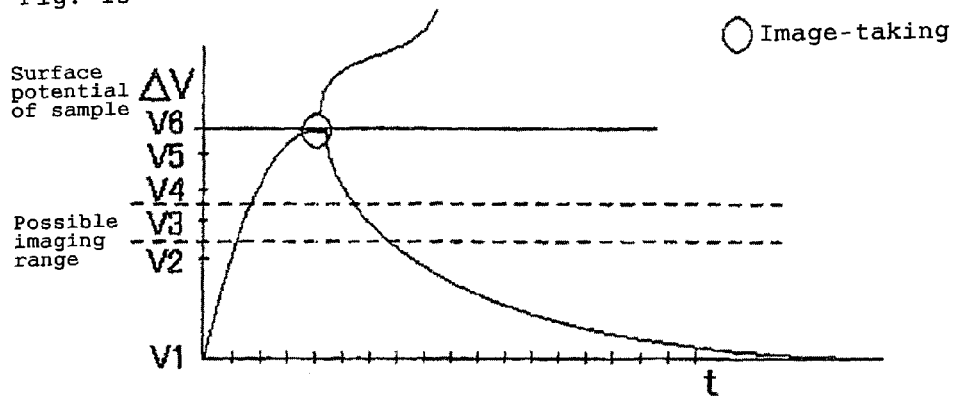
(A)
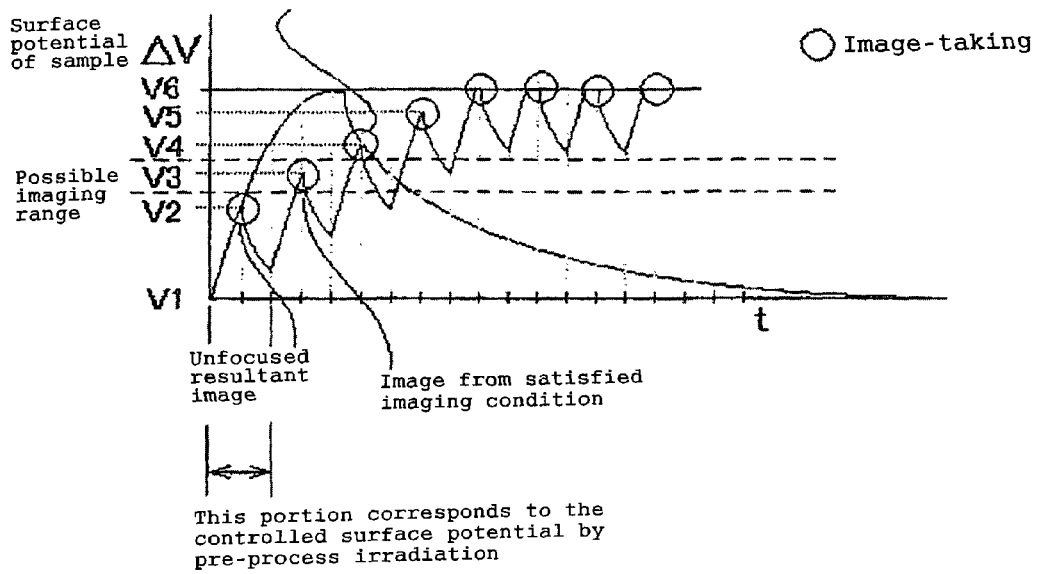
(B)
Fig. 15

METHOD AND APPARATUS FOR INSPECTING SAMPLE SURFACE

CROSS-REFERENCE TO RELATED APPLICATIONS

This application is a Divisional of U.S. application Ser. No. 13/398,112, filed Feb. 16, 2012, which is a Divisional of U.S. application Ser. No. 12/162,067, filed Jul. 24, 2008, which is a national stage application filed under 35 USC §371 of International Application No. PCT/JP2007/051047, filed Jan. 24, 2007, which claims the benefit of priority from Japanese Application No. 2006-16519, filed on Jan. 25, 2006, Japanese Application No. 2006-58847, filed on Mar. 6, 2006 and Japanese Application No. 2006-58862, filed on Mar. 6, 2006, the entire disclosures of which are hereby incorporated by reference.

FIELD OF THE INVENTION

The present invention relates to an inspection apparatus and an inspection method for inspecting a pattern formed in a surface of a sample and in particular, to a projection type electron beam sample inspection apparatus for inspecting or evaluating a pattern (for example, an overlay mark pattern) formed in a sample, such as a wafer or a substrate, by irradiating an electron beam onto the surface of the sample and an inspection method for inspecting or evaluating the pattern by using the same inspection apparatus.

BACKGROUND ART

A semiconductor manufacturing process involves the steps of exposing, etching and thin-film deposition, which steps are repeated several or a dozen times. One critical factor in those steps is defects that could be created in respective steps, and so the detection of electrical defects can be critical among others. In addition, matching (overlay) of locations between a wiring pattern formed in an under layer and a wiring pattern to be formed in an upper layer in a plurality of wiring patterns stacked one on top of the other is also critical.

It is extremely difficult for a conventional optical microscope to detect the electrical defect and it takes a long inspection period for a SEM (Scanning type Electron Microscope) to make an inspection over a large area.

Further, in such an inspection apparatus using an electron beam, an effect from charge-up in a sample surface could inhibit a clear image from being obtained. Further, in a conventional approach, the matching has been provided, for example, by making an alignment (an overlay inspection) by means of a light (an optical microscope) in conjunction with a mark of specified purpose (an overlay mark) employed for alignment of the locations between the pattern in the under layer and the pattern in the upper layer.

REFERENCE

Patent document: U.S. Pat. No. 6,091,249

DISCLOSURE OF THE INVENTION

Problem to be Solved by the Invention

As described above, in the inspection of the sample surface by using the electron beam, a resultant image could lack focus due to the charge-up in the sample surface caused by the electron beam irradiation. In addition, since the overly mark has a different pattern size from that of the actual device pattern, such an overlay inspection using light is subject to an effect of coma aberration from the light, often resulting in an alignment offset in which the actual device pattern is shifted and exposed to the light, even if the overlay mark is within a tolerance range in the alignment. Further, since the overly mark has a different pattern size from that of the actual device pattern, such overlay inspection by means of the light as described above is subject to an effect of coma aberration from the light, often resulting in the alignment offset in which the actual device pattern is shifted and exposed to the light, even if the overlay mark is within a tolerance range in the alignment.

The present invention has been made in the light of the problems pointed above, and an object thereof is to provide an inspection method and an inspection apparatus for inspecting a sample surface with highly improved accuracy enabled by controlling a sample voltage with charge-up in the sample taken into account, which would not be provided by the prior art, in the sample surface inspection apparatus used in a manufacturing process of a semiconductor device.

Another object of the present invention is to provide an inspection method and an inspection apparatus which enable a surface inspection to be carried with high accuracy by modifying a sample voltage in dependence on an amount of the electron beam.

Still another object of the present invention is to provide an inspection apparatus and an inspection method for inspecting a sample with high efficiency and high accuracy enabled by controlling a stage such that the stage may be moved in synchronism with an operating frequency of a sensor during inspection and a time required to move the stage may be minimized during the stage being moved between patterns to be inspected.

Another object of the present invention is to provide a projection type inspection apparatus or an inspection method for inspecting a surface adapted to improve a speed and accuracy in an inspection of a pattern by controlling an irradiation geometry of an electron beam relative to a pattern so as to be associated with a movement of a sample or by elongating it along the moving direction of the sample.

Means to Solve the Problem

According to a first aspect of the present invention, provided is a method for inspecting a sample surface by using an electron beam method sample surface inspection apparatus, in which an electron beam generated by an electron gun of the electron beam method sample surface inspection apparatus is irradiated onto the sample surface, and secondary electrons emanating from the sample surface are formed into an image toward an electron detection plane of a detector for inspecting the sample surface, the method characterized in that a condition for forming the secondary electrons into an image on the detection plane of the detector is controlled such that a potential in the sample surface varies in dependence on an amount of the electron beam irradiated onto the sample surface.

In one method for controlling the image forming condition for the secondary electrons in the present invention, a sample voltage or a retarding voltage may be modified in dependence on an amount of the electron beam irradiated onto the sample surface. Further, the detector may be an EB-CCD. It is to be noted that the detector may comprise a MCP and a TDI-CCD.

According to another aspect of the present invention, provided is an electron beam method sample surface inspection apparatus, comprising: an electron gun for generating an electron beam to be irradiated onto a sample surface; a primary optical system for guiding the electron beam onto the sample surface; a detector for detecting secondary electrons emanating from the sample surface; and a secondary optical system for guiding the secondary electrons onto the detector, the apparatus characterized in further comprising a voltage adjustment mechanism for modifying a potential in the sample surface in dependence on an amount of the electron beam.

In the invention as designated above, the apparatus may comprise as the voltage adjustment mechanism a means for modifying the sample voltage or the retarding voltage in dependence on an amount of the electron beam irradiated onto the sample surface.

Further, the detector may be an EB-CCD. It is to be noted that the detector may comprise a MCP and a TDI-CCD.

In the method and apparatus for inspecting a surface of a sample to provide a defect inspection or the like for a semiconductor device according to the present invention as designated above, preferably, the secondary optical system for guiding secondary electrons emanating from the sample surface in response to the electron beam irradiated onto the semiconductor wafer to the detector may include a quadruple lens and further the method may include a step for forming the secondary electrons into an image by using a plurality of electrostatic lenses.

Further, the detector for the secondary electrons may include, in addition to the MCP and the TDI-CCD as designated above, a fluorescent screen between the MCP and the TDI-CCD. Alternatively, an EB-TDI may be used instead of the MCP and the TDI-CCD, or an EB-CCD may also be used.

In the present invention as designated above, the voltage adjustment mechanism or the means for modifying the retarding voltage may comprise a stabilizing direct current power source for modifying an output voltage in accordance with an external signal and a computer serving for controlling the voltage modification, in which a command is input to the computer so that a resultant output value (output voltage) of the stabilizing current power source represents a desired value for modifying the potential in the sample surface.

According to another aspect of the invention, provided is an inspection method for inspecting a pattern formed in a sample by using an electron beam, the method characterized in that a stage holding a sample thereon is moved at a frequency in synchronism with an operating frequency of a sensor during inspection of a pattern to be inspected and a moving speed of the stage is controlled so that a time required for movement is minimized during the stage being moved to another pattern to be inspected.

In the inspection method as designated above, the pattern to be inspected may include two or more patterns consisting of different sectional structures or different materials, and a plurality of patterns may be inspected concurrently.

According to another aspect of the invention, provided is an inspection apparatus for inspecting a pattern formed in a sample by using an electron beam, comprising: a holding mechanism for holding the sample; a stage with the holding mechanism mounted thereon, and adapted to be movable in at least one direction; an electron beam source for generating electrons for irradiation of the electron beam directed to the sample; a first electro-optical system for guiding the electron beam generated from the electron beam source onto the sample for irradiation of the electron beam to the sample; a detector for detecting electrons emanating from the sample; and a second electro-optical system for guiding the electrons to the detector, the apparatus further comprising a control unit to provide control so that the stage is moved at a speed in synchronism with an operating speed of the detector during inspection of the pattern, and the stage is accelerated when being moved to another pattern on the sample.

In the inspection apparatus as designated above, the pattern to be inspected may include two or more patterns consisting of different sectional structures or different materials, and a plurality of patterns may be inspected concurrently.

According to another aspect of the invention, provided is an inspection apparatus for inspecting a pattern formed on a sample by using an electron beam, comprising: a holding mechanism for holding the sample; a stage with the holding mechanism mounted thereon, and adapted to be movable in at least one direction; an electron beam source for generating electrons for irradiation of the electron beam directed to the sample; a first electro-optical system for guiding the electron beam generated from the electron beam source onto the sample for irradiation of the electron beam to the sample; a detector for detecting electrons emanating from the sample; and a second electro-optical system for guiding the electrons to the detector, wherein an irradiation geometry of the electron beam to the pattern defines an elongated irradiation geometry that is longer than a length of the pattern along the moving direction of the stage during the stage being moved serially for inspecting the pattern so that the pattern could have been previously subject to the irradiation of electrons.

Further, according to another aspect of the invention, provided is an inspection apparatus for inspecting a pattern formed on a sample by using an electron beam, comprising: a holding mechanism for holding the sample; a stage with the holding mechanism mounted thereon, and adapted to be movable in at least one direction; an electron beam source for generating electrons for irradiation of the electron beam directed to the sample; a first electro-optical system for guiding the electron beam generated from the electron beam source onto the sample for irradiation of the electron beam to the sample; a detector for detecting electrons emanating from the sample; and a second electro-optical system for guiding the electrons to the detector, the inspection apparatus further comprising a control unit for controlling an irradiation geometry of the electron beam in association with an operation of the stage so that the irradiation geometry of the electron beam onto the pattern allows the pattern to be previously subject to the irradiation of electrons during the stage of moving serially for inspecting the pattern.

In the sample surface inspection apparatus according to the present invention as designated above, the secondary optical system for guiding secondary electrons emanating from the sample surface in response to the electron beam irradiated onto the sample, such as a semiconductor wafer, to the detector may include a quadruple lens and the apparatus may further include a step for forming the secondary electrons into an image by using a plurality of electrostatic lenses.

Further, the detector for the secondary electrons emanating from the sample may comprise the TDI and the fluorescent screen.

Further, the detector for the secondary electrons may include, in addition to the fluorescent screen and the TDI-CCD as designated above, a MCP located before the fluorescent screen.

Alternatively, an EB-TDI may be used instead of the MCP and the TDI-CCD, or an EB-CCD may also be used. Further, a combination of the MCP and the EB-CCD may be employed.

In the inspection apparatus as designated above, the pattern to be inspected may include two or more patterns consisting of different sectional structures or different materials, and a plurality of patterns may be inspected concurrently.

Effect of the Invention

As stated above, according to the present invention, in the inspection of the surface of the sample, such as a wafer, a substrate and the like, in the manufacturing process of the semiconductor device, the surface inspection with high accuracy can be achieved by modifying the sample voltage in dependence on an amount of the electron beam and thus quality and throughput of the semiconductor device can be improved.

Further, in the sample surface inspection, the detection of the overlay can be accomplished and thus the sample surface inspection apparatus with high accuracy in the semiconductor device manufacturing process can be supplied.

In addition, in the manufacturing of the semiconductor device, the detection of the overlay can be accomplished quickly yet with high accuracy and thus the defect inspection apparatus with high accuracy in the semiconductor device manufacturing can be supplied.

BRIEF DESCRIPTION OF THE DRAWINGS

FIG. 7 shows a relationship among a substrate voltage or a retarding voltage and an EB-CCD and a blanking signal;

FIG. 8 shows a diagram for illustrating an image formation condition for a secondary optical system;

FIG. 15 is a plot for illustrating a theory of an overlay image-taking;

Figure 1:
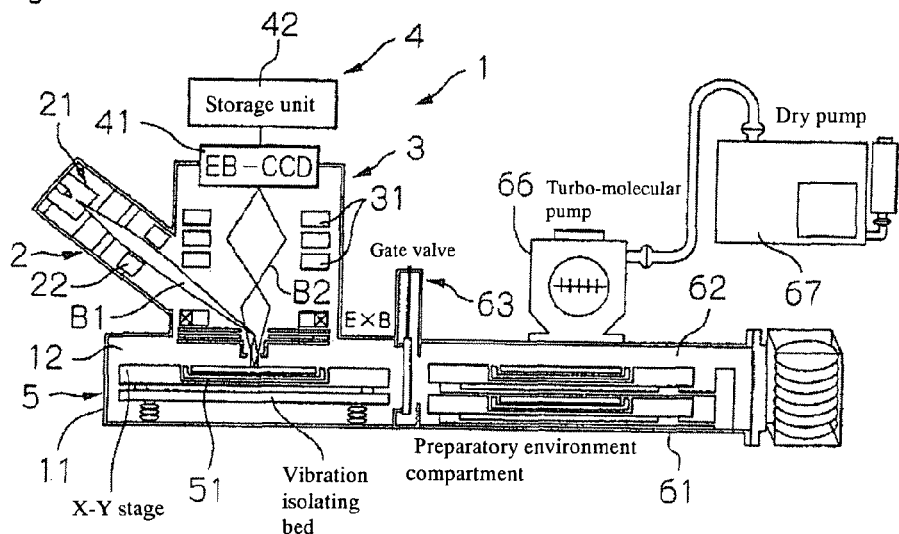
FIG. 1 is a schematic diagram of an apparatus embodying a surface inspection method of the present invention.

LIST OF REFERENCE NUMERALS 1, 1a Sample inspection apparatus
2, 2a Primary optical system
3 Secondary optical system
4 Detection system
5, 5a Stage unit
12 Chamber
21, 21a Electron gun
23 ExB filter
41, 41a Detector
42 Storage unit

BEST MODE FOR CARRYING OUT THE INVENTION

An embodiment of a method for inspecting a sample surface for any defects or the like according to the present invention will be described below.

First, referring to FIG. 1, an entire apparatus for implementing the embodiment of a surface inspection method for inspecting a sample surface for any defect is shown with reference numeral 1. In FIG. 1, reference numeral 2 designates a primary electro-optical system (hereinafter, simply referred to as a primary optical system), 3 a secondary electro-optical system (hereinafter, simply referred to as a secondary optical system), 4 a detection system, 5 stage unit disposed on a vibration isolation bed having a known structure, all of which are contained in a housing 11 defining a chamber 12. The chamber 12 is constructed such that it can be controlled to have a desired atmosphere, a vacuum atmosphere, for example, by a unit which is not shown.

A sample "W", such as a wafer or a substrate, for example (the following description of the present embodiment is directed to an example using the wafer as the sample) can be securely but removably placed on a wafer holding table 51 in the stage unit 5 having a known structure and function by a known means, such as an electrostatic chuck, for example. The wafer holding table 51 is configured to move serially or in a step-and-repeat manner in at least one direction of two orthogonal axial directions, or X and Y directions. A vibration proofing structure of the vibration isolating bed may be formed from a non-contacting bearing.

Figure 2:
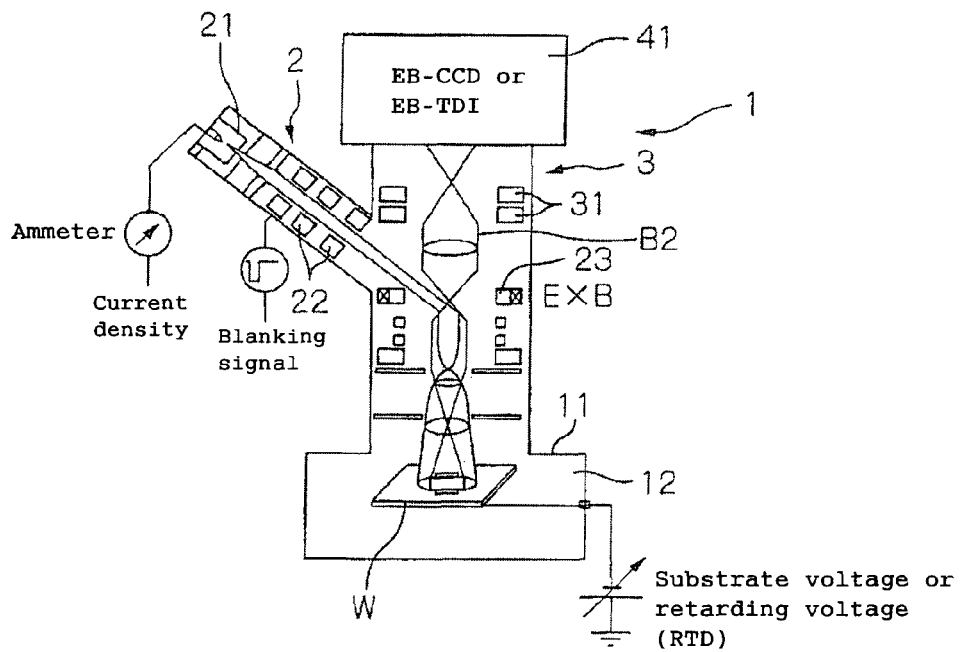
FIG. 2 shows the main component of FIG. 1 in detail.

As shown in detail in FIG. 2, an electron gun of the primary optical system for irradiating a primary electron beam may use an electron gun of a thermionic emission type or a Schottky type. The primary electron beam "B1" emitted from the electron gun 21 will have its configuration shaped properly via a quadruple lens 22 and the like of the primary optical system and then irradiated onto the surface of the sample or the wafer W placed on the wafer holding table 51. In this stage, the primary electron beam is guided through an ExB filter or Wien filter 23 comprising an electric field and a magnetic field to the wafer surface. The geometry of the primary electron beam emitted from the electron gun 21 of the primary optical system 2 may be shaped such that it is irradiated onto the sample surface with uniform distribution to an extent larger than an area corresponding to pixels of a TDI-CCD or a CCD constructing a detector 41 of the detection system 4.

Secondary electrons "B2" are generated from the surface of the wafer W in response to the irradiation of the primary electron beam, by an amount corresponding to energy of the primary electron beam. Those secondary electrons are accelerated by an electrode located adjacent to the wafer toward the defector side until the secondary electrons have a predetermined amount of kinetic energy. The accelerated secondary electrons B2 go straight through the ExB filter or Wien filter 23 comprising the electric field and the magnetic field as described above, and are guided to the secondary electro-optical system (hereinafter simply referred to as the secondary optical system) 3. In this stage, the wafer surface could have been charged by the irradiation of the primary electron beam, and consequently the secondary electrons may occasionally fail in acceleration to the predetermined amount of kinetic energy. In the event of such a failure, the secondary electrons could not be successfully formed into an image on a detection plane of the detector 41, resulting in no image obtained or an unfocused image. To address this, a charge amount from the electron beam irradiation over the wafer surface should be previously calculated, and the sample voltage or the retarding voltage should be modified adaptively in dependence on the calculated charge amount. This enables the secondary electrons to be accelerated to the predetermined amount of kinetic energy by taking the amount of charging from the electron beam irradiation into account.

Secondary electrons are formed into an image on the detector 41 as a map projection image by the secondary optical system 3. The electric lens or electrostatic lens 31, a component of the secondary optical system 3, comprises plural sheets of coaxially located electrodes having apertures or a plurality of electrode groups disposed coaxially, wherein a number of thus configured lenses are disposed in multi-level. The electric lens serves to enlarge image data possessed by the secondary electrons, while guiding it to the detector as map projection data so as not to lose position and surface data on the wafer W.

The detector 41 may comprise a MCP (Multi Channel Plate) in conjunction with a fluorescent screen and a TD-CCD or EB-CCD or EB-TDI. The electrons multiplied by the MCP are then converted to light in the fluorescent screen, which light signal is taken by the TDI-CCD and output as an image signal. Alternatively, the secondary electrons may be directly introduced into the EB-CCD for converting into the image signal.

It is to be noted that each of the components of the primary and the secondary optical system as well as the detecting system may have a known structure and function, and so any further description should be herein omitted.

The stage unit 5 for holding the wafer W may have a structure to provide a serial movement, if the detector is the TDI-CCD or the EB-TDI. Further, the stage is structured not only to make a serial movement but also to repeat a go-and-stop motion in case of the detector implemented by the TDI-CCD or the EB-TDI.

If the detector is the CCD or the EB-CCD, the stage is also allowed to repeat the go-and-stop motion.

The position of the stage is always measured by a laser interferometer, though not shown, in a known method, and a current value of the position given by the measurement from the laser interferometer is compared to a predetermined target value, and based on a resultant residual error, a signal for correcting the residual error is sent to an electrostatic lens control unit (not shown) of the secondary optical system 3. A correction mechanism is provided, in which a moving and stopping motion or a speed fleck and minute vibration during these motions may be corrected by modifying the path of the secondary electrons by means of the electrostatic lens as described above, so that a stable image-forming condition can be always provided on the detection plane of the detector. The stage unit is provided with a brake system (not shown), and the brake system may be used upon stopping of the stage so as to reduce or even eliminate any minute vibration during stopping motion.

If the detector is the TDI or the EB-TDI, the apparatus has such a function that the moving distance of the stage is measured by the laser interferometer, and the image data taken by the TDI or the EB-TDI may be forwarded each time the stage is moved by a predetermined distance.

Electric image data obtained by the detector 41 is stored in a storage unit 42. The storage unit 42 is contained in a control section for controlling the TDI-CCD so as to synchronize the timing for controlling the TDI-CCD with the timing for storing data. The image signal is input by a known method to an image processing unit though not shown, where signal processing or image analysis is carried out in a known method to identify the location of defect and determine the type of defect, and the result may be notified to an observer, while at the same time being stored in a storage media.

For the overlay inspection, a shift length in an orthogonal two directions or in the X and Y directions and a shift amount in a rotational angle ($\theta$) between the under layer pattern formed in advance and the upper layer pattern formed thereon are calculated from the image analysis to determine whether the overlay is right or wrong.

For the defect inspection, a cell-to-cell inspection for making a comparison between patterns in a repeated pattern arrangement or a die-to-die inspection for making a comparison between images through pattern matching by every die may be applied. Alternatively, a die-to-any die inspection for making a comparison of one die to other many dies or a die-to-CAD data inspection for making a comparison of one die to a predetermined pattern in the specific design may be applied. To determine whether a defect exists or not, a difference is determined relative to the comparative image and a site with a larger difference should be considered defective.

Further, for the defect inspection, a physical defect in an oxide film transcription pattern or in a wiring, an electrical defect of short-circuit and an electrical defect of open-circuit, such as potential contrast or voltage contrast, can be also detected. The items to be inspected may be a product of wafer, a TEG (Test Element Group), a reticle or a mask.

The inspection may be selectively performed in an on-line or off-line inspection, and it is also possible in the on-line inspection method to provide a feedback of an inspection result directly to a semiconductor manufacturing line as an electric signal or the like via a signal line. Further, it is also possible in the off-line inspection method that the inspection result is directly input from a terminal of the inspection apparatus to provide a feedback thereof to the semiconductor manufacturing line as an electric signal or the like via a signal line. The inspection result may be used for quality control in the course of manufacturing process via a communication with a host computer in the semiconductor manufacturing line.

With reference to FIG. 1, the description is now directed to an operation for loading the wafer W as before the inspection onto the stage unit 5 within the chamber 12 and unloading the wafer W as after the inspection from the stage unit.

A preparatory environment compartment 62 located adjacent to the chamber 12 of the sample surface inspection apparatus 1 is configured such that in the semiconductor manufacturing process, an environment associated with the wafer carried in from the outside is altered to an environment existing inside the chamber 12 where the stage unit 5 with the wafer holding table 51 is located, until the environment within the preparatory environment compartment 62 is in conformity with the environment inside the chamber 12 to allow the wafer as before the inspection to be carried in from the preparatory environment compartment 62 onto the wafer holding table.

Specifically, a gate valve 63 is disposed between the housing 11 and a housing 61. The housing 11 defines the chamber 12 containing the vibration isolating bed having a known vibration proofing structure, and the stage unit 5 having the wafer holding table 51. The stage unit 5 is disposed on the vibration isolating bed. The housing 61 defines the preparatory environment compartment 62. The chamber 12 and the preparatory environment compartment 62 can be selectively placed in communication with each other or blocked from each other, via the gate valve 53. In addition, another gate valve or flange may be arranged in order to introduce, into the preparatory environment compartment, the wafer in the chamber and the preparatory environment compartment 62. In this regard, when the wafer is transferred between the preparatory environment compartment 62 and the chamber 12 through the gate valve 63, the environments inside both of the chamber and the compartment are kept substantially equal (e.g., in a vacuum atmosphere at a degree of vacuum around $10^{-4}$ Pa to $10^{-6}$ Pa).

Since in the semiconductor manufacturing process, the wafer subject to the inspection before being transferred to a subsequent step is held in an environment suitable for a transfer to the subsequent step, the preparatory environment compartment is firstly controlled to achieve the environment for transferring the wafer to the subsequent step in a known manner by means of a gas supply unit (not shown) and a vacuum evacuation unit, both having a known structure. Once the environment for transferring the wafer to the subsequent step and the environment inside the preparatory environment compartment (vacuum condition) have become equal, the another valve or flange operable to introduce the wafer into the preparatory environment compartment is opened to allow the wafer to be introduced into the preparatory environment compartment 62, where the vacuum evacuation system or the gas supply unit as mentioned above is controlled to now achieve the same environment (vacuum condition) as the environment in which the wafer holding table 51 is located or inside the chamber 12.

After that, the gate valve 63 for isolating the chamber 12 from the preparatory environment compartment 62 is opened to allow the wafer W as before the inspection to be transferred onto the wafer holding table 51 (this step referred to as loading). After the transfer of the wafer as before the inspection having been completed, the gate valve 63 is closed, and the environment in which the wafer holding table is located is adjusted to be suitable for the inspection and then the inspection is started.

When the wafer having finished with the inspection is carried out of the wafer holding table 51 (the operation referred to as unloading) and transferred to the subsequent step, the operation may be carried out in an inverse order to the loading. In this regard, preferably the vacuum evacuation unit may be implemented by a combination of a turbo-molecular pump 66 with a dry-root pump 67, but a rotary pump equipped with an oil mist trap or a molecular sieve may be used instead of the dry-roots pump.

Figure 3:
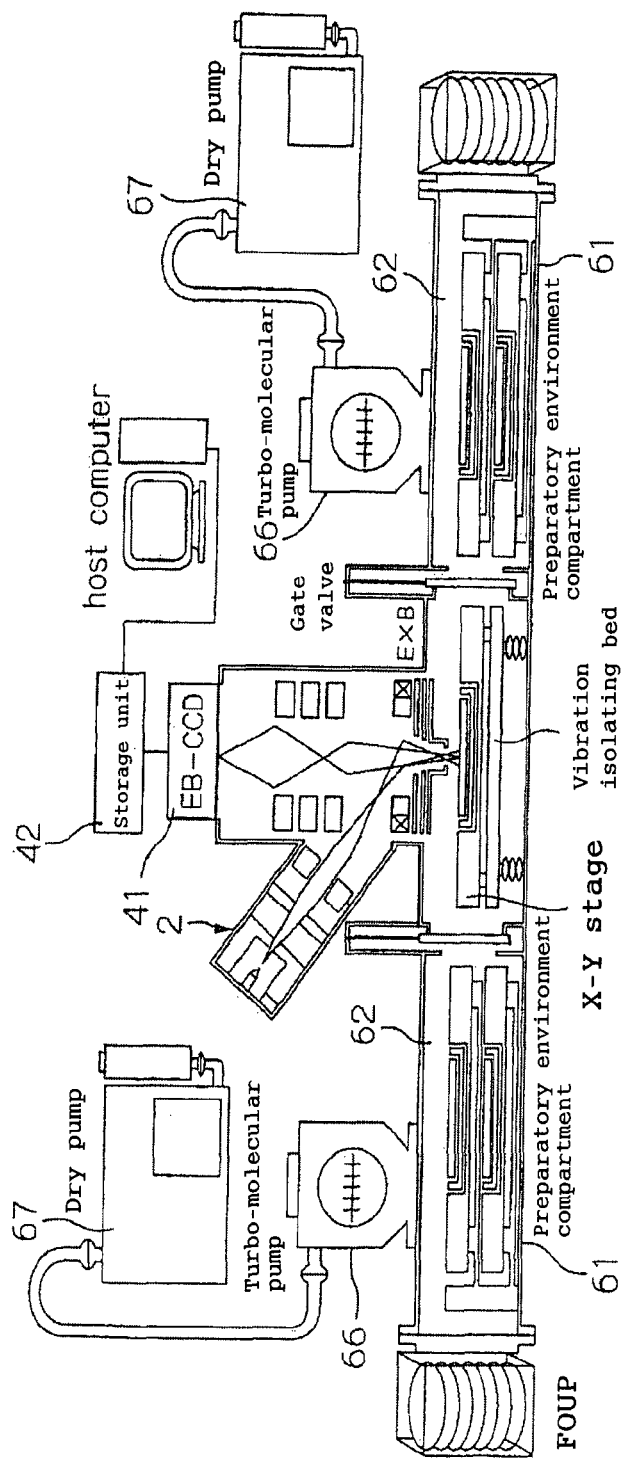
FIG. 3 is a diagram illustrating an embodiment of a surface inspection apparatus equipped with a plurality of preparatory environment compartments.

FIG. 3 shows an embodiment comprising a plurality (two in the illustrated embodiment) of preparatory environment compartments 62. The loading and the unloading operations of the wafer to be inspected may be carried out concurrently in a parallel manner. In addition, the preparatory environment compartment may have a function for storing a stock consisting of a plurality of wafers at one time. In this case, the number of operations for opening the gate valve may be reduced and so an efficient inspection as well as loading and unloading operations can be achieved.

Figure 4:
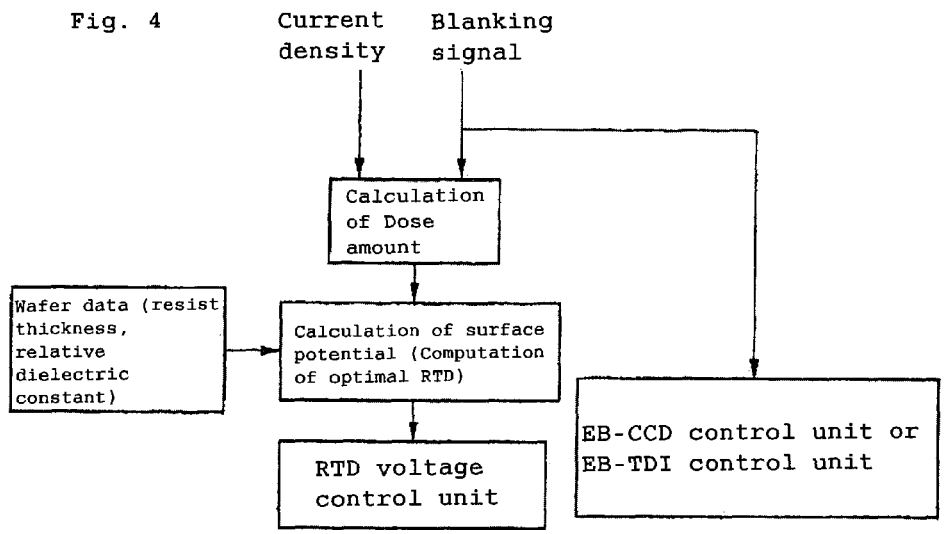
FIG. 4 is a flow chart for controlling a substrate voltage or a retarding voltage.

FIG. 4 shows a control flow of a wafer voltage (also referred to as a substrate voltage, a sample voltage or a retarding voltage, whereas collectively referred to as the wafer voltage for the purport of clarity). The flow as illustrated in FIG. 4 represents the flow in one-shoot image-taking in the Still-mode with the CCD or the EB-CCD or the TDI-CCD. The wafer voltage (the substrate voltage, the sample voltage or the retarding voltage) is referred to as a voltage that is previously applied to a sample, such as a wafer and a substrate.

This represents the embodiment in which a Dose amount (referred to as a dosage of the electron beam, representing an amount of irradiated charges as per a unit area over a sample such as a wafer and a substrate, hereinafter referred to as the Dose amount) is calculated from a signal of current density and a blanking signal so as to control the EB-CCD by using the blanking signal.

A current density "$J_e$" can be computed from an electron current value of an electron gun. The Dose amount for the wafer surface can be calculated from the current density $J_e$ and a blanking cancellation time "$\tau_S$" of the blanking signal.

Wherein, Dose amount=$J_e \cdot \tau_S$

The electrostatic capacity "C" as per unit area in the sample surface, or the wafer surface, can be determined from the data on the wafer surface, for example, a resist thickness "d" and a relative dielectric constant "$\in_r$".

Wherein, $C = \in_r \cdot \in_0 / d$ (unit area is calculated by cm$^2$, $\in_0$ is a dielectric constant in vacuum)

In addition, from CV=Q, a variation in wafer surface voltage $\Delta V = Q/C$, wherein, the wafer surface voltage may be also referred to as a substrate surface voltage or a sample surface voltage, representing a voltage determined by summing up (superposing) an originally applied wafer voltage and a voltage applied through the irradiation of the electron beam to the wafer.

On the other hand, the "Q" represents a total amount of electrons irradiated to the wafer surface and assuming that a secondary electron emission rate is denoted by "$\gamma$" at the time of landing energy "LE" (keV), then $Q$=Dose amount$\cdot(1-\gamma)=J_e \cdot \tau_S \cdot (1-\gamma)$ Therefore, the variation in wafer surface voltage can be expressed as follows:

$\Delta V = J_e \cdot \tau_S \cdot (1-\gamma) \cdot d / \in_r \cdot \in_0$

Accordingly, the wafer voltage (or the retarding voltage) RTD should be adjusted to satisfy RTD+$\Delta V$=design value (secondary electron drawing voltage).

Figure 5:
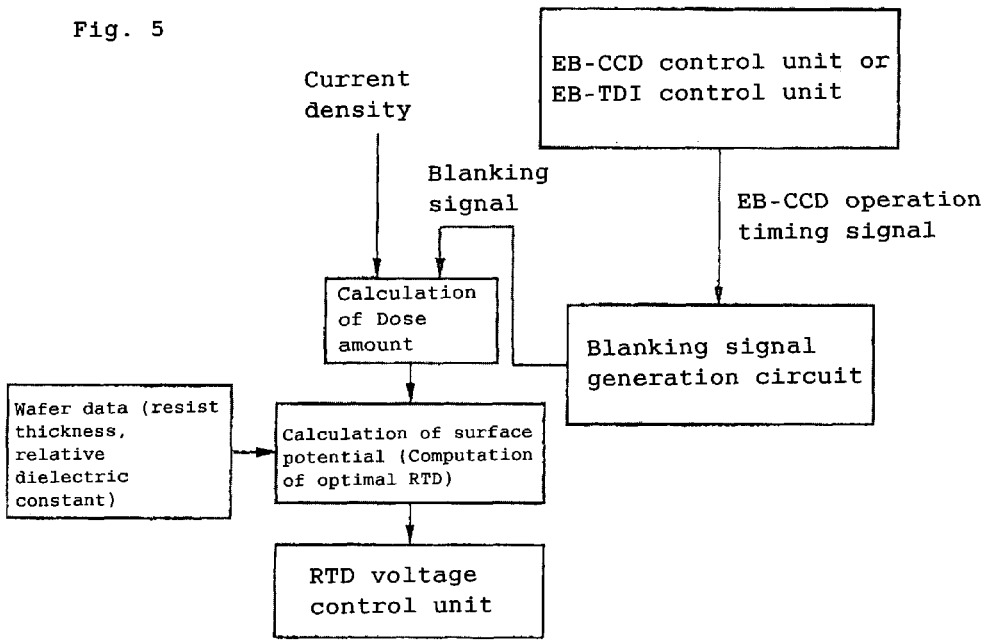
FIG. 5 is another flow chart for controlling a substrate voltage or a retarding voltage.

FIG. 5 shows another control flow of the wafer voltage.

This represents an embodiment for a case where the blanking signal is determined based on the signal from EB-CCD, and the Dose amount is determined from the blanking signal and a current density signal.

Figure 6:
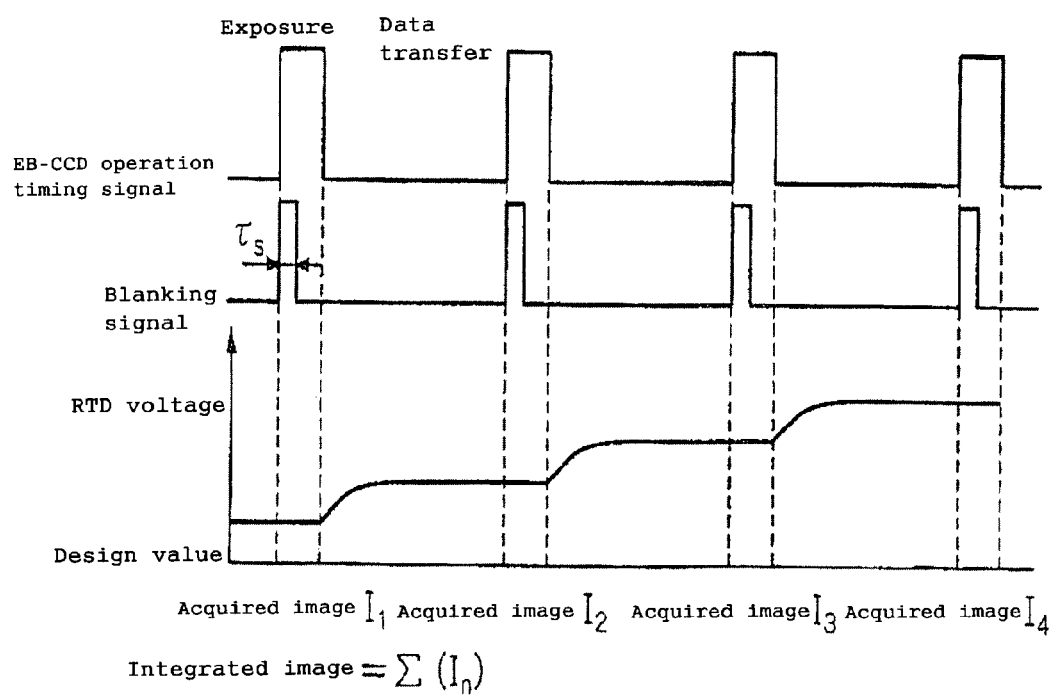
FIG. 6 shows another example of a blanking signal.

FIG. 6 illustrates a relationship among the wafer voltage, the EB-CCD and the blanking signal, when one-shoot image-taking in the Still-mode with the CCD or EB-CCD or TDI-CCD is performed serially by a number of times. Since the Dose amount varies at each image-taking operation, therefore the wafer voltage (the retarding voltage) must be adjusted in each case. That is to say, the same image can be always obtained by adjusting the wafer voltage in each case, and integration is applied to those images to obtain an image with high S/N ratio and thus to improve the precision during image analysis.

It is to be noted that the integration may be repeated by any times as desired. Specifically, an optimal number of times of integration may be set according to the specific conditions of the wafer. In this way, the inspection can be carried out under an optimal inspection condition according to the specific wafer.

FIG. 7 shows another embodiment of the blanking signal. In this embodiment, since a blanking cancellation would occur by a number of times during an exposure period to the EB-CCD, the variation in wafer surface voltage ΔV can be expressed as follows:

$$\Delta V = J_e \cdot \Sigma(\tau_S) \cdot (1-\gamma) \cdot d / \in_r \cdot \in_0$$

In this way, the image can be obtained by adjusting the Dose mount such that the sum of the wafer voltage and the variation in wafer surface voltage can satisfy the image formation condition for the secondary optical system. The exposure period and the blanking cancellation period can be determined relatively as desired. Specifically, the blanking cancellation period may be longer than the exposure period. In this case, to calculate the Dose amount, the exposure time may be substituted for the $\tau_S$.

Referring now to FIG. 8, a specific image forming condition of the secondary optical system will be described. A primary electron beam generated by an electron gun is irradiated onto a surface of a wafer (or a substrate) prepared as a sample via a primary optical system (not shown in FIG. 8). Secondary electrons emanate from the wafer surface in response to the irradiation of the electron beam. Those secondary electrons are guided to a secondary optical system by using a combination of a wafer voltage (or a retarding voltage) with a voltage by an electrode located in the secondary optical system. In this step, the secondary electrons are guided so as to satisfy an image forming condition as determined previously in the specific design and thus formed into an image on a detection plane of a detector represented by an EB-CCD.

If the potential in the surface of the wafer varies due to the irradiation of the electron beam, the combination of the wafer voltage with the voltage by the electrode located in the secondary optical system could not satisfy the image forming condition as determined previously in the design, and consequently the secondary electrons can not be formed into an image on the detection plane of the detector.

To address that, an amount of potential in the wafer surface that would be varied in dependence on the irradiation of the electron beam may be previously superposed on the combination of the wafer voltage with the voltage by the electrode located in the secondary optical system.

The primary electron beam generated by the electron gun is irradiated onto the surface of the wafer (or the substrate) prepared as the sample via the primary optical system (not shown in FIG. 8). During this step, the electron beam is irradiated concurrently to a plurality of patterns formed on the substrate consisting of at least two different types of materials or at least two different types of sectional structures. Further, the electron beam is irradiated onto an area larger than a field of view in a mapping optical system. From this wafer surface, the secondary electrons emanate in response to the irradiation of the electron beam. Those secondary electrons are guided to the secondary optical system by means of a combination of the wafer voltage (or the retarding voltage) with the voltage by the electrode located in the secondary optical system. During this step, the secondary electrons are guided so as to satisfy the image forming condition as determined previously in the specific design and formed into an image on the detection plane of the detector represented by the EB-CCD. In this way, when the plurality of patterns formed on the substrate consisting of at least two different types of materials or two different types of sectional structures are irradiated concurrently, the different types of materials or the different types of sectional structures have different amounts of charge-up from one another, and so if the substrate voltage or the retarding voltage is set to the specific charge-up amount in conformity with either one of the materials or sectional structures, then the contrast between the different types of materials or sectional structures on the substrate can be enhanced for image formation.

Further, by providing the irradiation of the electron beam onto the area larger than the field of view of the mapping optical system, the symmetry of the image in the X- and Y-directions can be ensured and thus an enlarged image representing realistically an actual image (an actual pattern) can be obtained.

Although before the irradiation of the electron beam, the combination of the wafer voltage (or the retarding voltage) of the secondary optical system with the voltage by the electrode located in the secondary optical system is not in conformity with the image forming condition as determined previously in the design, as a change occurs in the potential in the wafer surface by the irradiation of the electron beam, the secondary electrons are due to satisfy the image forming condition for the secondary optical system as determined previously in the design and thus can be formed into an image on the detection plane of the detector.

The combination of the wafer voltage with the voltage by the electrode located in the secondary optical system may be set as desired in dependence on the specific type of the sample, such as the substrate and the wafer or the specific material of the surface of the sample in conjunction with a current value or a current density or an energy of the electron beam.

The combination of the wafer voltage with the voltage by the electrode located in the secondary optical system may be set so that the secondary electrons, after a number of times of irradiation, can satisfy the image forming condition for the secondary optical system as determined previously in the design.

The combination of the wafer voltage with the voltage by the electrode located in the secondary optical system may be set such that for each irradiation of the electron beam, the secondary electrons may satisfy the image forming condition for the secondary optical system as determined previously in the design, so that when the electron beam is irradiated by a number of times, the combination of the wafer voltage with the voltage by the electrode located in the secondary may be controlled for each irradiation of the electron beam such that the secondary electrons can satisfy the image forming condition for the secondary optical system as determined previously in the design. In this case, the images obtained during each time of irradiation may be summed up.

When a scanning image is taken by scanning the stage or the electron beam, the combination of the substrate voltage or the retarding voltage with the voltage by the electrode located in the secondary optical system may be controlled in response to the current density or current value of the electron beam and the scanning speed of the stage or electron beam so that the secondary electrons can satisfy the image forming condition for the secondary optical system as determined previously in the design.

An embodiment of an overlay inspection method will now be described.

Figure 9:
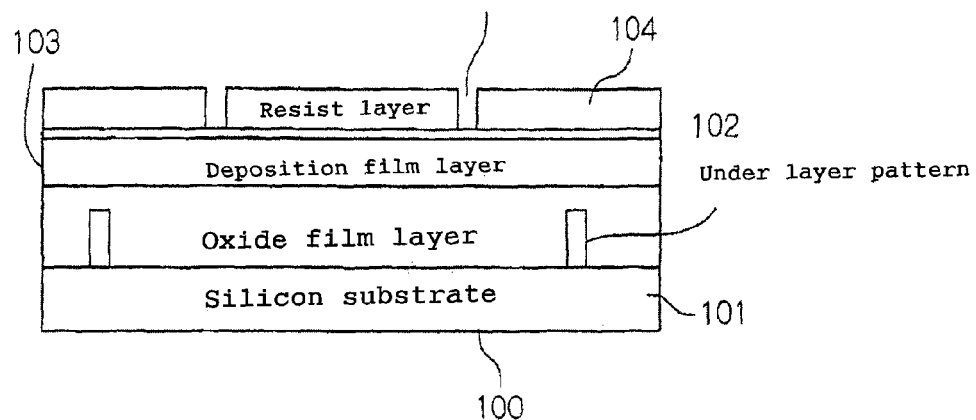
FIG. 9 is a conceptual diagram of an overlay.

First referring to FIG. 9, there is shown a conceptual diagram illustrating an overlay inspection. In FIG. 9, reference numeral 100 designates a silicon substrate, 101 an oxide film layer, 102 an under layer pattern, 103 a deposition film layer, and 104 a resist layer after having been exposed to a light and then developed. A semiconductor manufacturing process involves a number of etching processes. An etching process provides the steps of applying a resist over a deposition film to be desirably etched, for example, the oxide film 103; exposing the resist to a light or an electron beam and then developing it so as to form a desired pattern in the resist layer 104; and etching and thereby removing a portion of the deposition film, for example, the oxide film that is not covered with the resist layer so as to form it into a desired pattern.

Over the pattern 102 that has been created in the first etching process (hereinafter used to refer a pattern of an overlay mark), the step of burying or deposition of a new film is applied, and thus formed film will again need to be processed by etching. In this stage, the pattern (an under layer pattern) 102 that has been created in the previous process and a pattern (an upper layer pattern) 105 that will be newly created by etching must be in conformity to each other in accordance with a design. To address this, a mark for alignment is used to inspect the conformity between the under layer pattern 102 and the upper layer pattern 105.

Since the resist has been already applied over the under layer pattern for the etching of the upper layer pattern, the under layer pattern needs to be viewed or observed through the resist. Further, the inspection of the overlay requires that the upper layer pattern and the under layer pattern must be viewed or observed simultaneously.

In the overlay inspection, primarily the under layer pattern may often reside beneath the resist or the oxide film. Occasionally, it may reside beneath a conductive layer. Primarily, the upper layer pattern may be formed by exposing the resist to a light, which can be accomplished by the exposure only, or by the steps up to the post-baking or up to the development.

Figure 10:
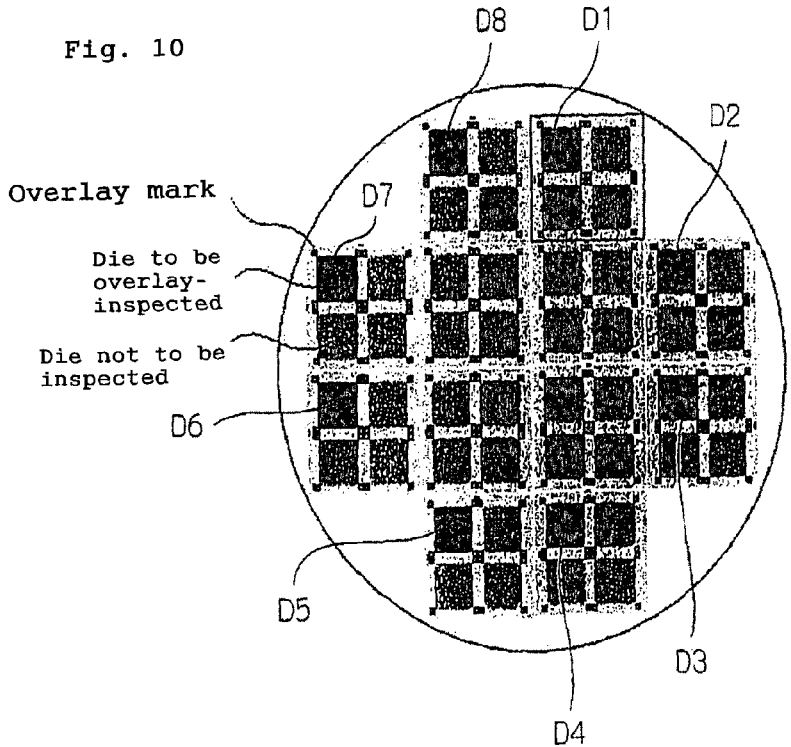
FIG. 10 is a conceptual diagram illustrating an inspection area.

FIG. 10 shows a conceptual diagram of an inspection area. The overlay inspection may be applied to a limited number of dies, such as D1 to D8 in FIG. 2, for example, but not to every one of the dies. Consequently, in order to reduce the time required for travelling between dies to be inspected, the stage should be accelerated up to its maximum speed for travelling between the dies to be inspected.

Figure 11:
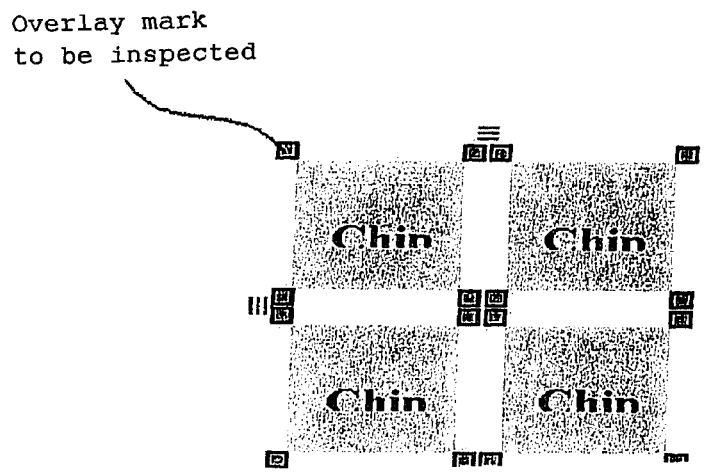
FIG. 11 is a conceptual diagram of an overlay mark arrangement.

Referring now to FIG. 11, there is shown a conceptual diagram of an overlay mark arrangement. The overlay mark can be occasionally arranged in each die in such a configuration as shown in FIG. 11. The inspection is occasionally limited to certain marks but not applied to every one of the overlay marks. Therefore, in order to reduce a time required for travelling between the marks, the stage is accelerated to a maximum speed for travelling between the marks.

Figure 12:
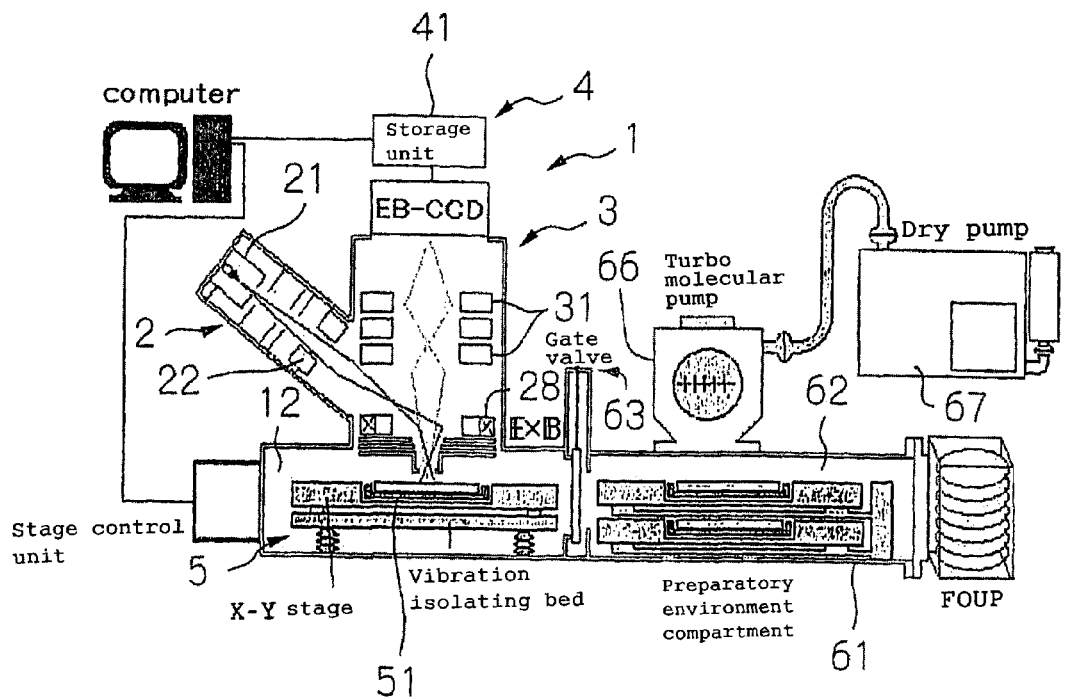
FIG. 12 is a schematic diagram of an example of an apparatus embodying a surface inspection method of the present invention.

Referring now to FIG. 12, an entire apparatus for implementing a surface inspection method for inspecting a sample surface for any defect or the like on a sample surface according to the present embodiment is designated by reference numeral 1. Since the apparatus of the present embodiment is similar to that of FIG. 1 except that a computer is coupled to both of the stage control unit and the storage unit 41, description on the structure and the operation of common parts is herein omitted.

A sample "W", such as a wafer or a substrate, for example (the following description of the present embodiment is directed to an example using the wafer as the sample) may be securely but removably placed on a wafer holding table 51 in the stage unit 5 having a known structure and function by a known means, such as an electrostatic chuck, for example. The wafer holding table 51 is configured to move serially or in a step-and-repeat manner in at least one direction of two orthogonal axial directions, or X and Y directions. A vibration proofing structure of the vibration isolating bed may be formed from a non-contacting bearing.

As shown in detail in FIG. 2, an electron gun 21 of the primary optical system for irradiating a primary electron beam may use an electron gun of a thermionic emission type or a Schottky type. It is to be noted that the electron gun 21 may be separate from the components of the primary optical system. The primary electron beam "B1" emitted from the electron gun 21 will have its configuration shaped properly via a quadruple lens 22 and the like of the primary optical system and then irradiated onto the surface of the sample or the wafer W placed on the wafer holding table 51. In this stage, the primary electron beam is guided through an ExB filter or a Wien filter 28 comprising an electric field and a magnetic field to the wafer surface.

An electron beam may be shaped by the lens of the primary optical system such that a size of an irradiation area on the sample is larger than that of a pattern in the sample surface, especially the pattern size of the overlay pattern. Further, the electron beam is shaped such that it has substantially a circular or elliptical shape and it has generally uniformly distributed beam intensity. The electron beam is irradiated substantially onto a center of the overlay mark. The irradiation of the electron beam onto the sample surface is provided by a blanking electrode (not shown) located in the middle of the primary optical system 2. When the electron beam is to be irradiated onto the sample surface, the voltage at the electrode is set to 0V (zero volt) or to a voltage level required to control the path of the electron beam, and the electron beam is advanced substantially centrically through the primary optical system. If the electron beam is not intended to irradiate the sample surface, a sufficient voltage to divert the electron beam completely out of the primary optical system is applied to the blanking electrode so as to guide the electron beam to an outer wall constituting the primary optical system or a specialized electrode (not shown) or the like to achieve blanking for preventing the electron beam from being irradiated onto the sample surface.

Figure 13:
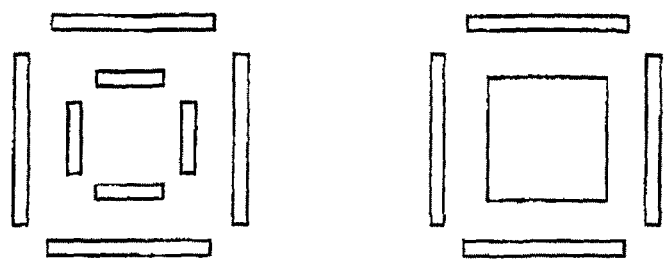
FIG. 13 shows a pattern of an overlay.

FIG. 13 shows an overlay mark or an overlay pattern. The overlay mark may employ a bar-in-bar type or a bar-in-box type pattern. The outer bars represent an under layer pattern below a resist layer and the inner bars or box represent the resist pattern, which may have been undergone the steps up to exposure, exposure and PEB (preheating) or up to development. The under layer pattern may be an STI structure or may be a metal wiring or a trench structure.

Secondary electrons "B2" are generated from the surface of the wafer W in response to the irradiation of the primary electron beam, by an amount corresponding to energy of the primary electron beam. Those secondary electrons are accelerated by an electrode located adjacent to the wafer toward the defector side until the secondary electrons have a predetermined amount of kinetic energy. The accelerated secondary electrons B2 go straight through the ExB filter or Wien filter 28 comprising the electric field and the magnetic field as described above, and are guided to the secondary electro-optical system (hereinafter simply referred to as the secondary optical system) 3. In this stage, the wafer surface could have been charged by the irradiation of the primary electron beam, and consequently the secondary electrons may occasionally fail in acceleration to the predetermined amount of kinetic energy. In the event of such a failure, the secondary electrons could not be successfully formed into an image on a detection plane of a detector 41, resulting in no image obtained or an unfocused image. To address this, a charging amount from the electron beam irradiation over the wafer surface should be previously calculated, and a sample voltage or a retarding voltage should be modified adaptively in dependence on the calculated charging amount. This enables the secondary electrons to be accelerated to the predetermined amount of kinetic energy by taking the amount of charging from the electron beam irradiation into account.

Secondary electrons are formed into an image on the detector 41 as a map projection image by the secondary optical system 3. The electric lens or electrostatic lens 31, a component of the secondary optical system 3, comprises plural sheets of coaxially located electrodes having apertures or a plurality of electrode groups disposed coaxially, wherein a number of thus configured lenses are arranged in multi-level. The electric lens serves to enlarge image data possessed by the secondary electrons, while guiding it to the detector as map projection data so as not to lose position and surface data on the wafer W.

The detector 41 may comprise a MCP (Multi Channel Plate) in conjunction with a fluorescent screen and a TD-CCD or EB-CCD or EB-TDI. The electrons multiplied by the MCP are then converted to light in the fluorescent screen, which light signal is taken by the TDI-CCD and output as an image signal. Alternatively, the secondary electrons may be directly introduced into the EB-CCD for converting into the image signal.

It is to be noted that each of the components of the primary and the secondary optical system as well as the detecting system may have a known structure and function, and so any further description should be herein omitted.

The stage unit 5 for holding the wafer W may have a structure to provide a serial movement if the detector is the TDI-CCD or the EB-TDI. Further, the stage is structured not only to make a serial movement but also to repeat a go-and-stop motion in case of the detector implemented by the TDI-CCD or the EB-TDI.

If the detector is the CCD or the EB-CCD, the stage is also allowed to repeat the go-and-stop motion.

The position of the stage is always measured by a laser interferometer, though not shown, in a known method, and a current value of the position given by the measurement from the laser interferometer is compared to a predetermined target value, and based on a resultant residual error, a signal for correcting the residual error is sent to an electrostatic lens control unit (not shown) of the secondary optical system 3. A correction mechanism is provided, in which a moving and stopping motion or a speed fleck and minute vibration during these motions may be corrected by modifying the path of the secondary electrons by means of the electrostatic lens as described above, so that a stable image-forming condition can be always provided on the detection plane of the detector. The stage unit is provided with a brake system (not shown), and the brake system may be used upon stopping of the stage so as to reduce or even eliminate any minute vibration during stopping motion.

The electric image data obtained by the detector 4 is input to an image processing unit, though not shown, where signal processing or image analysis is carried out to identify the location of defect and determine the type of defect, and the result may be notified to an observer, while being stored in a storage media. For the overlay inspection, a shift length in the X and Y directions and a shift amount in a rotational angle (θ) between the under layer pattern and the upper layer pattern are calculated from the image analysis to determine whether the overlay is right or wrong.

The inspection may be selectively performed in an on-line or off-line inspection, and it is also possible in the on-line inspection method to provide a feedback of an inspection result directly to a semiconductor manufacturing line as an electric signal or the like via a signal line. Further, it is also possible in the off-line inspection method that the inspection result is directly input from a terminal of the inspection apparatus to provide a feedback thereof to the semiconductor manufacturing line as an electric signal or the like via a signal line. The inspection result may be used for quality control in the course of manufacturing process via a communication with a host computer in the semiconductor manufacturing line.

Since the operations for loading the wafer W as before the inspection onto the stage unit 5 within the chamber 12 and unloading the wafer W as after the inspection out of the stage unit are similar to those described above with reference to FIG. 1, the detailed description is herein omitted. It is a matter of course that a configuration comprising a plurality (two in this embodiment) of the preparatory environment compartments 62 as shown in FIG. 3 may be applicable to the illustrated embodiment.

A Dose amount (referred to as a dosage of the electron beam, representing an amount of irradiated charges as per a unit area over a sample such as a wafer and a substrate, hereinafter referred to as the Dose amount) is calculated from a signal of current density and a blanking signal, and the EB-CCD is controlled by using the blanking signal.

The theory for controlling the RTD voltage or the substrate voltage will be as follows, similarly to that in the embodiment above. A current density "$J_e$" can be computed from an electron current value of an electron gun. The Dose amount for the wafer surface can be calculated from the current density $J_e$ and a blanking cancellation time "$\tau_S$" of the blanking signal.

Wherein, Dose amount=$J_e \cdot \tau_S$

The electrostatic capacity "C" as per unit area in the sample surface, or the wafer surface, can be determined from the data on the wafer surface, for example, a resist thickness "d" and a relative dielectric constant "$\in_r$".

Wherein, $C = \in_r \cdot \in_0 / d$ (unit area is calculated by cm², $\in_0$ is a dielectric constant in vacuum)

In addition, from CV=Q, a variation in wafer surface voltage ΔV=Q/C, wherein, the wafer surface voltage may be also referred to as a substrate surface voltage or a sample surface voltage, representing a voltage determined by summing up (superposing) an originally applied wafer voltage and a voltage applied through the irradiation of the electron beam to the wafer.

On the other hand, the "Q" represents a total amount of electrons irradiated to the wafer surface and assuming that a secondary electron emission rate is denoted by "γ" at the time of landing energy "LE" (keV), then $Q$=Dose amount·(1−γ)=$J_e \cdot \tau_S \cdot$(1−γ)

Therefore, the variation in wafer surface voltage can be expressed as follows:

$\Delta V = J_e \cdot \tau_S \cdot (1-\gamma) \cdot d / \in_r \cdot \in_0$

Accordingly, the wafer voltage (or the retarding voltage) RTD should be adjusted to satisfy RTD+ΔV=design value (secondary electron drawing voltage).

Figure 14:
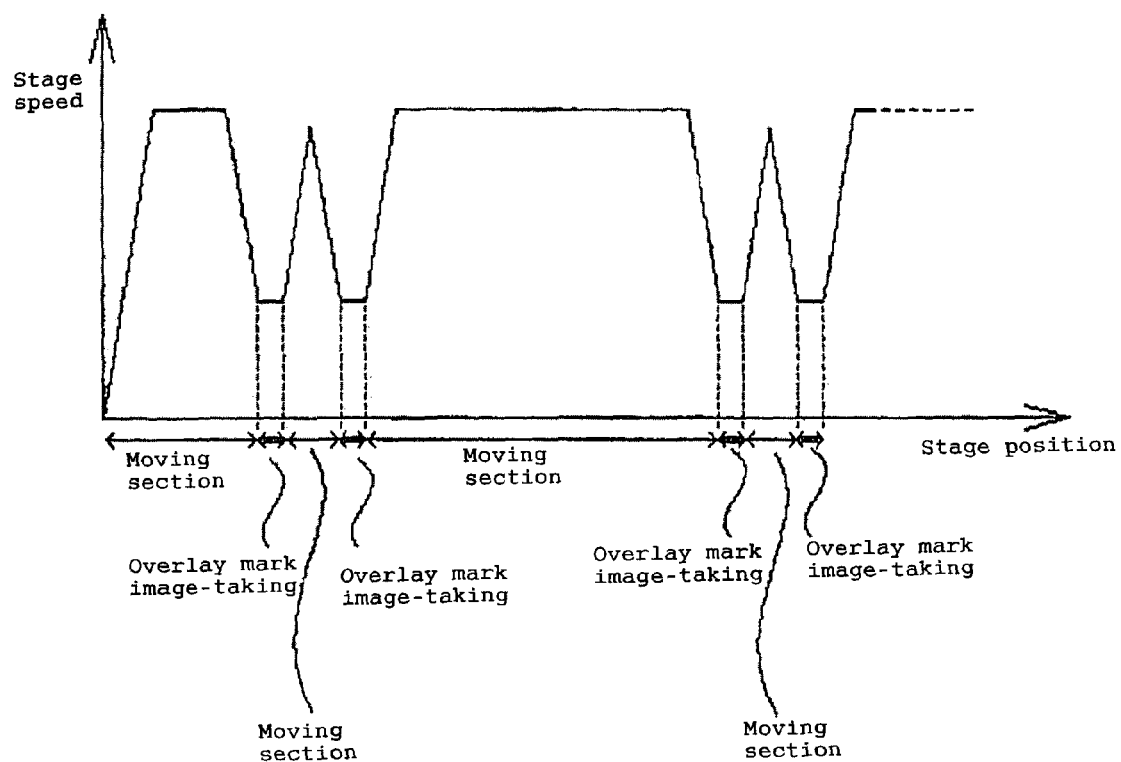
FIG. 14 is a conceptual diagram illustrating a movement of a stage.

FIG. 14 shows a conceptual diagram of a motion of the stage. The description will be given to the stage motion in a case where the EB-TDI or the TDI is employed as the detector for image-taking operation. The stage is accelerated up to a maximum speed until it reaches the position of the overlay mark as determined previously, and then in the overlay mark region, the stage is moved at a speed in synchronism with an operating frequency of the EB-TDI or the TDI for taking an image of the overlay mark. Further, when moving to another overlay mark, the stage is moved while being accelerated.

A step-and-repeat motion is performed for taking an image by the EB-CCD or the CCD. It is to be noted that to take an image of the overlay mark, the same overlay mark may be used repeatedly by a number of times for image-taking.

For the overlay inspection, there may be a case where the condition to determine the ΔV for viewing the under layer pattern is different from the condition to determine the ΔV for viewing the upper layer pattern. Since in this case, it is impossible to obtain the upper layer pattern and the under layer pattern at the same time, the image taking operation is carried out a number of times to thereby obtain the lower layer pattern and the upper layer pattern separately, and those images are combined to form a synthetic image, from which any misalignment between the under layer pattern and the upper layer pattern may be detected or calculated. In this operation, the same pattern may be repeatedly used for image-taking. Alternatively, the repeated image taking may be applied to each die repeatedly or may be applied to each wafer repeatedly. To do this, preferably the conditions for obtaining an image, especially the RTD and the Dose amount, may be set to the conditions suitable for the under layer pattern.

Especially, there may be a case where the sectional structure or the material of the substrate surface and thus a time period for charging and a time period for the charges in the surface to escape (discharging period) are different from each other in dependence on the specific process. In such a case, even if a single pattern is subject to image-taking, the pattern may be subject to image-taking with a time difference rather than repeated serial operations.

Turning now to FIGS. 15(A) and 15(B), the theory of the overlay image-taking will be described. In FIGS. 15(A) and 15(B), respectively, the vertical axis indicates a potential in the surface of the sample or the wafer and the horizontal axis indicates a time elapsed since the beginning of the electron beam irradiation.

The description is herein directed to the image-taking by a single irradiation as shown in FIG. 15(A). If an amount of irradiation of electrons is increased for the image-taking to be accomplished by a single irradiation, the potential in the wafer surface could rise to V6 within a charging period determined in dependence on a feature of the wafer surface. Assuming that the condition for forming the secondary electrons from the wafer surface into an image by adjusting the surface potential and the RTD is V3, then in the single image-taking operation as shown in FIG. 15(A), the surface potential of the wafer would exceed the level of the image forming condition before the image being taken, resulting in only an unfocused image or no image obtained.

Further, if the amount of irradiation (i.e., dose) of electrons is decreased in order to make the final surface (V6) to V3 by being charged, an amount of secondary electrons is decreased, and accordingly a resultant image would be dark or no image would be obtained.

In contrast to that, when the irradiation of electron beam is given little by little with some interval between irradiations, as shown in FIG. 15(B), the wafer surface potential can be discharged during the interval between respective irradiations, so that the potential in the wafer surface can be controlled by taking advantage of the charging and discharging from the irradiation to thereby make it possible to take an image at a specific timing that can produce V3 representing the image forming condition.

Figure 16:
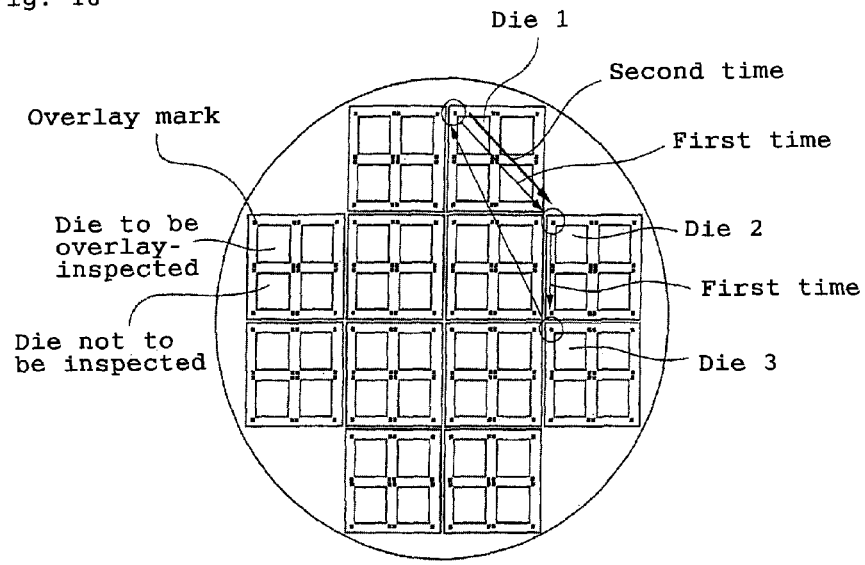
FIG. 16 is a drawing representing a conceptual diagram of image-taking with a time difference.

The above approach is illustrated in a conceptual diagram in FIG. 16. This shows an example of an operation for such a substrate that requires a longer time for discharging so that the surface potential is not easily attenuated, in which if the repeated image taking operations are carried out continuously, the surface potential would vary quickly and significantly and thus the RTD adjustment could not provide sufficient effect to satisfy the image forming condition of the secondary EO (Electro-Optic) system or of the secondary optical system which provides the image forming condition of the secondary electrons on the detector surface.

After taking an image of pattern (i.e., a pattern of an overlay mark formed in a die, which will be used in the reference) 1 in a die 1 by a single time, the operation process is moved to a pattern 2 in a die 2 for taking an image thereof by a single time, and then moved to a pattern 3 in a die 3 for taking an image thereof by a single time, followed by taking images of a plurality of dies including die 4, a die 5 . . . and a die n, each by a single time, and after a series of image-taking of every die of n dies each by single time having been completed, the operation process returns back to the pattern 1 of the die 1 for a second image-taking.

Each second image-taking is applied to the die 2, the die 3 . . . and the die n, and in this way, this operation is repeated by m times as required.

In this regard, any misalignment between the upper layer pattern and the under layer pattern may be calculated from a synthetic image from the image taken in the first image-taking and the image taken in the second image-taking, in which the images to be used to form the synthetic image may be those taken at any time of the image-taking operation as desired.

Although FIG. 16 shows an example where the image-taking operation is conducted while moving from one die to another die, if images of a plurality of patterns within a single die are to be taken, then a plurality of image-taking operations may be carried out while moving from one pattern to another pattern within the die. Again in this case, any misalignment between the upper layer pattern and the under layer pattern may be calculated from a synthetic image from the image taken in the first operation and the image taken in the second operation, in which the images to be used to form the synthetic image may be those taken at any time of image-taking operation as desired.

As shown in FIG. 16, if the image-taking of one pattern is repeated by a number of times, as moving from one pattern to another pattern, preferably the apparatus may have a function for controlling a speed of the stage so that a distance of stage movement should be minimized and a time required for moving the stage should be equal among all movements (the interval between image-taking of respective patterns should be made constant).

If there are a large number of patterns to be inspected, the patterns may be organized into groups of a desired number of patterns so as to conduct the image-taking on a group-by-group basis, rather than taking images of all patterns at once. Preferably, the n number of patterns contained in the group may be determined from a time difference (or an interval period) required for image-taking and a moving speed of the stage, as calculated from the feature regarding the charging period and the discharging period of the substrate.

The feature regarding the charging period and the discharging period of the substrate is input previously into the control unit for controlling the movement of the stage, which will be combined with the position data of the pattern to be inspected for calculating the condition where the distance or time period of movement between patterns can be minimized and the period of movement between patterns is equal among all patterns.

Further, the feature regarding the charging period and the discharging period of the substrate is input previously into the control unit for controlling the movement of the stage, which will be combined with the position data of the pattern to be inspected for calculating a specific number of patterns to be required for inspection and calculating the condition where the inspection time can be minimized and the period of movement between patterns is equal among all patterns.

Specifically, the procedure will be carried out in the following steps.

First of all, the discharging period from a point of time when the electron beam is irradiated onto the wafer until the charge amount in the wafer surface becomes 0 or a predetermined value is measured. Then, a number or positions of the overlay marks subject to image-taking, or the groups of overlay marks subject to image-taking are determined based on the calculated discharging period as stated above. Specifically, as described above, since in the illustrated embodiment, a contrast suitable for image-taking can be obtained by repeating several times a series of operations in which the irradiation of the electron beam is applied to the overlay mark at a single location and before the charge amount in the wafer surface becomes 0 or the predetermined value, another electron beam irradiation to the same overlay mark is carried out, therefore it is required to adjust the time interval from the first irradiation of the electron beam to the predetermined overlay mark to the second irradiation of the electron beam to the same overlay mark so as not to exceed the discharging time period.

Secondly, the period for moving between overlays should be adjusted equally. This yields an equal time interval between one irradiation and another of the electron beam to each overlay and thus the equal charge amount in each overlay results in a homogeneous image taken for each overlay. To adjust the moving period, the highest moving speed of the stage is taken as a reference. In the illustrated embodiment, the overlays to be measured are previously determined, and the moving period taken in the case to move the stage by the longest moving distance between two of those determined overlays at the highest speed has been taken as a reference (the moving period in this case is referred to as a reference moving period). Then, the stage moving speed between the respective overlays may be set such that the moving period for between respective overlays should be equal to the reference moving period. If a sum of the moving periods obtained in the above procedure exceeds the discharging period, the selection of the overlays should be made again.

In another embodiment, every combination of the moving distances between the overlay marks as well as the maximum moving speed of the stage are previously stored in the storage media in an apparatus, and the discharging period is input through the input section in the apparatus, so that the computing section in the apparatus may execute an operation to determine a path to allow the maximum number of overlays to be subject to the image-taking operation within a range not exceeding the discharging period of the wafer surface or the time determined by subtracting a desired time period from the discharging period.

Further, there would be a case where the moving speed or the acceleration varies along respective axes, such as along the X- or Y-axis, or depending on each specific position along the axes in accordance with a configuration of the stage, and in such a case, the variation should be taken into account for calculating or computing the moving period.

When the images of the upper and the under layer patterns are taken separately from each other, the RTD should be controlled in dependence on the Dose amount.

Irradiation of laser light may be employed as a method for controlling the $\Delta V$. This irradiation of the laser light can provide a more precise control for a surface potential increment. The laser light is irradiated in advance and then the electron beam is irradiated. The surface potential increment has been modified by a quantum effect from the irradiation of the laser light, and the surface potential increment in the sample surface, which could not have been fine-tuned simply through the Dose amount control, can be now successfully tuned, so that a clearer image can be obtained.

The surface potential tuning by the irradiation of the laser light and the adjustment of the RTD and the Dose amount can be provided by controlling these three factors together in a comprehensive manner and concurrently.

Although it is possible to apply the integration by all images in case of repeated image taking, alternatively the upper layer pattern image and the under layer pattern image may be taken separately, wherein the laser light irradiation amount and the potential increment in the sample surface can be fine-tuned only when taking the under layer pattern image. Alternatively, the potential increment in the sample surface by the irradiation of the laser light may be fine-tuned when taking the image of the upper layer pattern, or the laser light irradiation may be provided at any times. Further, the laser light irradiation may be provided during no image being taken, but it is suspended or blocked during the image taking.

Figure 17:
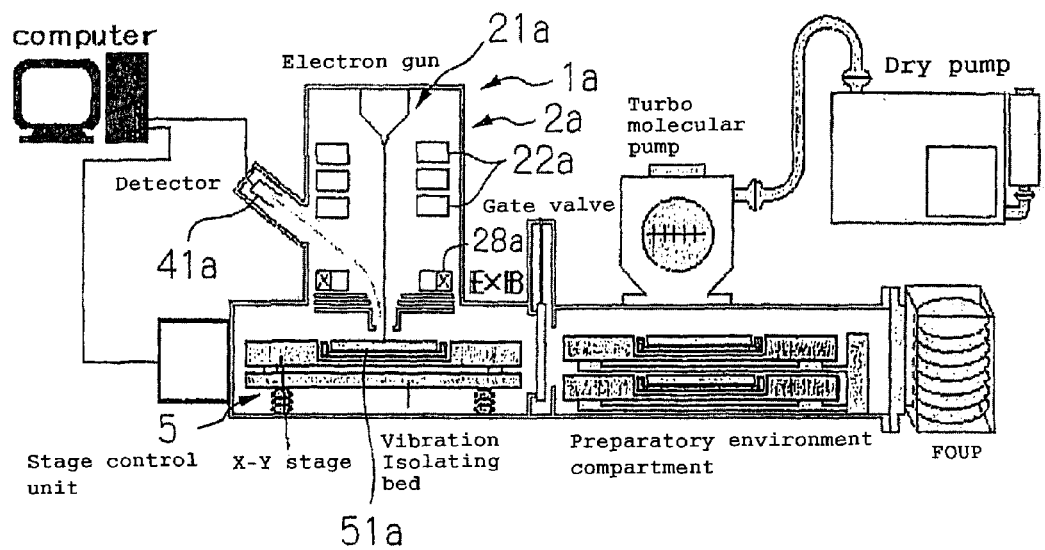
FIG. 17 shows another example of the present invention.

Referring now to FIG. 17, a sample inspection apparatus according to another embodiment of the present invention is generally shows by reference numeral 1a. In the inspection apparatus 1a, an electron gun 21a of a thermionic emission type or a Schottky type for irradiating an electron beam onto the wafer is located right above a stage unit 5a. A primary electron beam B1 emitted from the electron gun is irradiated onto a wafer surface, while its beam configuration being shaped through a primary optical system 2a comprising an electrostatic lens 22a, such as a quadruple lens and the like. The primary electron beam is irradiated onto an overlay mark, while being driven to make a scanning operation in the X- and the Y-directions.

Same as the foregoing embodiment, the wafer may be securely but removably placed on a wafer holding table 51 in the stage unit 5 having a known structure and function by a known means, such as a vacuum chuck, for example. The wafer holding table 51 is configured to move serially or in a step-and-repeat manner in at least one direction of two orthogonal axial directions, or X and Y directions. A vibration proofing structure of the vibration isolating bed may be formed from a non-contacting bearing.

Secondary electrons B2 are generated from the surface of the wafer in response to the irradiation of the electron beam, by an amount corresponding to energy of the primary electron beam. Those secondary electrons are accelerated by an adjacent electrode until the secondary electrons have a predetermined amount of kinetic energy and then guided to a detector 41a via a secondary optical system, though not shown. In this stage, the wafer surface could have been charged by the irradiation of the electron beam, and consequently the secondary electrons may occasionally fail in acceleration to the predetermined amount of kinetic energy as designed. In the event of such a failure, no image or an unfocused image could be obtained. To address this, as applied in the foregoing embodiment, a charging amount from the electron beam irradiation over the wafer surface should be previously calculated, and the substrate voltage or the retarding voltage should be modified adaptively in dependence on the calculated charging amount. This enables the secondary electrons to be accelerated to the predetermined amount of kinetic energy by taking the amount of charging from the electron beam irradiation into account. Processing of the image detected by the detector may be carried out in a similar manner to that described in the foregoing embodiment, and any detailed description should be herein omitted.

Operations for loading the wafer W as before the inspection onto the stage unit 5a within the chamber 12 and unloading the wafer W as after the inspection are similar to the operations in the foregoing embodiment, and the description will be herein omitted.

Figure 18:
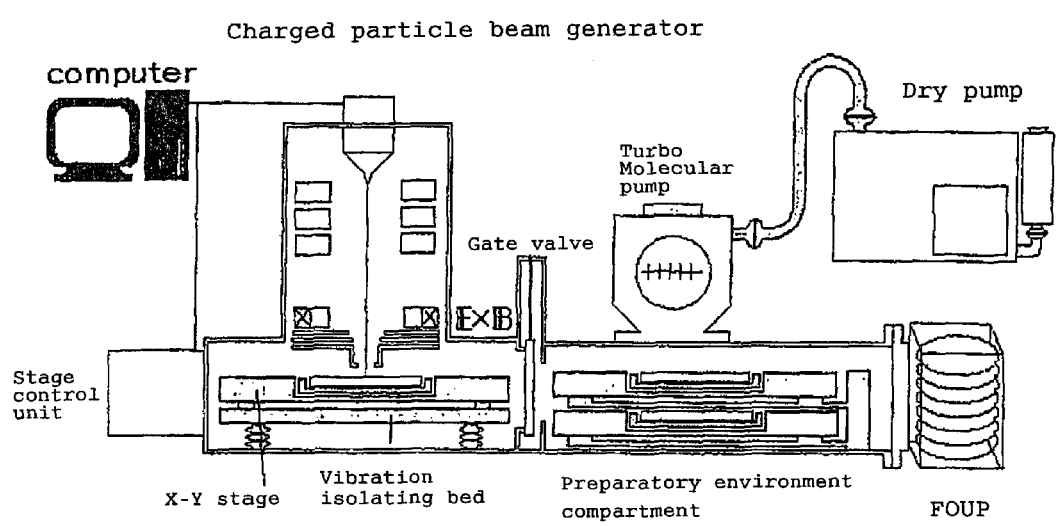
FIG. 18 shows yet another example of the present invention.

FIG. 18 shows yet another example of the present invention. FIG. 18 depicts a processing apparatus using a charged particle beam, in which the movement of the stage as shown in FIG. 16 is also applicable to a case for processing a material, such as an insulating material, that is easily charged and associated with a problem of precision of processing arising from being charged. If the work piece is easily charged and consequently could not be processed in a single operation with a high energy density, then it is processed with a lower energy density. If there are a number of work pieces, the process may make use of a time waiting for a first work piece to be discharged so as to move to a second work piece and process during this waiting period.

Although FIG. 18 shows an example of a charged particle beam, an energy particle beam including, for example, a high-speed atomic beam, or an energy beam including, for example, a laser, a maser and an X-ray may be used instead of the charged particle beam.

It is to be noted that since the configuration and operations of the processing apparatus may be similar to those in the conventional ones with an exception of its pattern inspection apparatus and inspection method according to the present invention, any detailed description on those will be herein omitted.

Yet another embodiment of a sample surface inspection method according to the present invention will now be described. A conceptual diagram of the overlay inspection is similar to the illustration of FIG. 9 and the description on that will be omitted.

Further, since the apparatus used in this embodiment is similar to that shown in FIG. 1, the description will be given again with reference to FIG. 1.

In FIG. 1, an entire apparatus for implementing a surface inspection method for inspecting a sample surface for any defect and so on is shown with reference numeral 1. In FIG. 1, reference numeral 2 designates a primary electro-optical system (hereinafter, simply referred to as a primary optical system), 3 a secondary electro-optical system (hereinafter, simply referred to as a secondary optical system), 4 a detection system, 5 a stage unit disposed on a vibration isolating bed having a known structure, all of which are contained in a housing 11 defining a chamber 12. The chamber 12 is constructed such that it can be controlled to have a desired atmosphere, a vacuum atmosphere, for example, by a device though not shown.

A sample "W", such as a wafer or a substrate, for example (the following description of the present embodiment is directed to an example using the wafer as the sample) may be securely but removably placed on a wafer holding table 51 in the stage unit 5 having a known structure and function by a known means, such as a chuck, for example. The wafer holding table 51 is configured to move serially or in a step-and-repeat manner in at least one direction of two orthogonal axial directions, or X and Y directions. A vibration proofing structure of the vibration isolating bed may be formed from a non-contacting bearing.

The electron gun 21 of the primary optical system for irradiating a primary electron beam may use an electron gun of a thermionic emission type or a Schottky type. It is to be noted that the electron gun may be a separate component from the primary optical system. The primary electron beam B1 emitted from the electron gun 21 is irradiated onto the surface of the sample or the wafer W placed on the wafer holding table 51 while being shaped in its configuration properly via the primary optical system 2 comprising an electrostatic lens, such as a quadruple lens 22 and the like.

Figure 19:
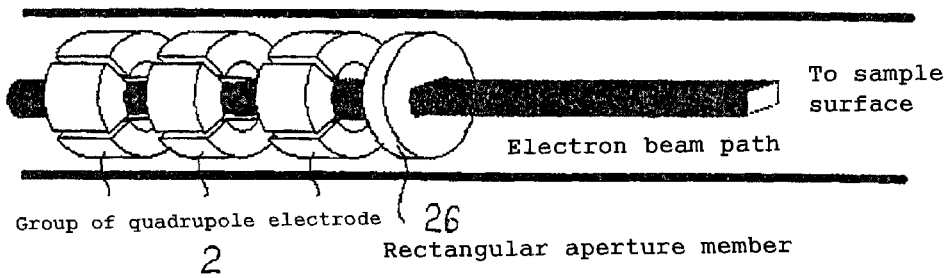
FIG. 19 is a diagram illustrating a principle of electron beam formation.

An electromagnetic lens may be used in addition to the electrostatic lens such as the quadruple lens for shaping the electron beam. In FIG. 19, there is shown a conceptual diagram for shaping the beam configuration by using additionally a shielding element having an aperture or an opening of a desired geometry, such as an aperture member 26. The quadruple lens has been applied in advance with a voltage so as to form the beam into a desired beam size and geometry which are predetermined. The configuration of the aperture has been also selected to be suitable for forming the beam into the desired beam size and geometry which are predetermined. It is also possible to provide a plurality of aperture members, each having a different configuration, which will be exchangeably used in accordance with the specific type of wafer or inspection pattern. The voltage applied to the quadruple lens may be also varied in dependence on the specific type of wafer or inspection pattern. Those may be controlled by a control unit for controlling the bean configuration, which is capable of calculating the condition automatically to determine a combination of the voltage applied to the quadruple lens with the configuration of the aperture.

It is possible to shape the beam configuration only with a rectangular aperture. In this case, the beam configuration is controlled by the control unit operable to control the beam configuration in accordance with the specific type of wafer or inspection pattern, in which the control unit calculates a condition automatically for selecting an optimal aperture. Further, the configuration of the aperture may be an elliptical shape in addition to the rectangular shape.

In this stage, the primary electron beam is guided through an ExB filter or a Wien filter 28 comprising an electric field and a magnetic field, to the wafer surface. The electron beam is formed into the beam sized to be larger than the size of the pattern in the sample surface, especially of the overlay pattern.

Figure 20:
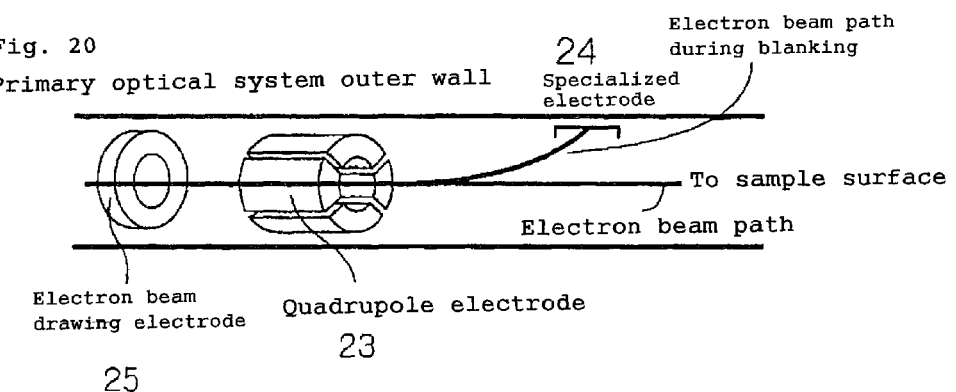
FIG. 20 is a conceptual diagram of a blanking operation.
Figure 21:
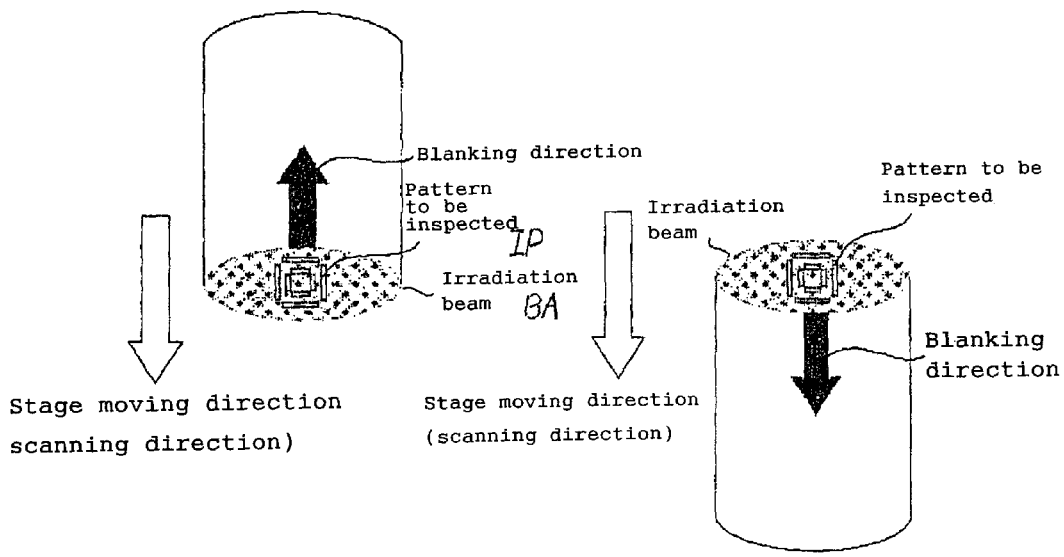
FIG. 21 is a conceptual diagram of a blanking direction.

The electron beam is formed to achieve a generally uniform distribution of the beam intensity. The electron beam is irradiated substantially to a center of the overlay mark. The irradiation of the electron beam onto the sample surface is controlled by a blanking electrode 23 located in the middle of the primary optical system 2, as shown in FIG. 20. When the electron beam is to be irradiated onto the sample surface, the voltage at the electrode is set to 0V (zero volt) or to a voltage level required to control the path of the electron beam, and the electron beam is advanced substantially centrically through the primary optical system. If the electron beam is not intended to irradiate the sample surface, a sufficient voltage to divert the electron beam completely out of the primary optical system is applied to the blanking electrode 23 so as to guide the electron beam to an outer wall constituting the primary optical system or a specialized electrode 24 or the like to achieve blanking for preventing the electron beam from being irradiated onto the sample surface. The blanking electrode may be constructed from a quadruple electrode. The direction for deflecting the electron beam may be either of the orthogonally crossing X direction or Y direction, or the diagonal direction (including an X-directional component and an Y-directional component). The blanking electrode 23 may comprise a quadruple electrode. FIG. 21 shows a conceptual diagram of the direction for deflecting the electron beam. In FIG. 21, "IP" designates a pattern to be inspected including an under layer pattern 102 and an upper layer pattern, and "BA" designates an irradiation range of the primary electron beam. Preferably, the direction for deflecting the electron beam may be either in the heading direction of the stage or the opposite direction thereto.

The direction for deflecting the electron beam may be any desired direction relative to the heading direction of the stage.

Since the overlay mark or the overlay pattern used in the illustrated embodiment is similar to that shown in FIG. 13, and the explanation thereof is herein omitted.

Secondary electrons "B2" are generated from the surface of the wafer W in response to the irradiation of the primary electron beam, by an amount corresponding to energy of the primary electron beam. Those secondary electrons are accelerated by an electrode located adjacent to the wafer toward the defector side until the secondary electrons have a predetermined amount of kinetic energy. The accelerated secondary electrons B2 go straight through the ExB filter or Wien filter 28 comprising the electric field and the magnetic field as described above, and are guided to the secondary electro-optical system (hereinafter simply referred to as the secondary optical system) 3. In this stage, the wafer surface could have been charged by the irradiation of the primary electron beam, and consequently the secondary electrons may occasionally fail in acceleration to the predetermined amount of kinetic energy. In the event of such a failure, the secondary electrons could not be successfully formed into an image on a detection plane of a detector 41, resulting in no image obtained or an unfocused image. To address this, a charging amount from the electron beam irradiation over the wafer surface should be previously calculated to determine a beam size and a shape thereof. This enables the secondary electrons to be accelerated to the predetermined amount of kinetic energy by taking the amount of charging from the electron beam irradiation into account.

Secondary electrons are formed into an image on the detector 41 as a map projection image by the secondary optical system 3. The electric lens or electrostatic lens 31, a component of the secondary optical system 3, comprises plural sheets of coaxially located electrodes having apertures or a plurality of electrode groups disposed coaxially, wherein a number of thus configured lenses are arranged in multi-level. The electric lens serves to enlarge image data possessed by the secondary electrons, while guiding it to the detector as map projection data so as not to lose position and surface data on the wafer W.

The detector 41 may comprise a MCP (Multi Channel Plate) in conjunction with a fluorescent screen and a TD-CCD or EB-CCD or EB-TDI. The electrons multiplied by the MCP are then converted to light in the fluorescent screen, which light signal is taken by the TDI-CCD and output as an image signal. Alternatively, the secondary electrons may be directly introduced into the EB-CCD for converting into the image signal.

It is to be noted that each of the components of the primary and the secondary optical system as well as the detecting system may have a known structure and function, and so any further description should be herein omitted.

Further, the secondary electrons after having been multiplied by the MCP may be introduced directly into the EB-TDI. In addition, the fluorescent screen along with the TDI may construct the detector.

The stage unit 5 for holding the wafer W may have a structure to provide a serial movement if the detector is the TDI-CCD or the EB-TDI. Further, the stage is structured not only to make a serial movement but also to repeat a go-and-stop motion in case of the detector implemented by the TDI-CCD or the EB-TDI.

If the detector is the CCD or the EB-CCD, the stage is also allowed to repeat the go-and-stop motion.

The position of the stage is always measured by a laser interferometer, though not shown, in a known method, and a current value of the position given by the measurement from the laser interferometer is compared to a predetermined target value, and based on a resultant residual error, a signal for correcting the residual error is sent to an electrostatic lens control unit (not shown) of the secondary optical system 3. A correction mechanism is provided, in which a moving and stopping motion or a speed fleck and minute vibration during these motions may be corrected by modifying the path of the secondary electrons by means of the electrostatic lens as described above, so that a stable image-forming condition can be always provided on the detection plane of the detector. The stage unit is provided with a brake system (not shown), and the brake system may be used upon stopping of the stage so as to reduce or even eliminate any minute vibration during stopping motion.

The electric image data obtained by the detector 4 is input to an image processing unit, though not shown, where signal processing or image analysis is carried out to identify the location of defect and determine the type of defect, and the result may be notified to an observer, while being stored in a storage media. For the overlay inspection, a shift length in the X and Y directions and a shift amount in a rotational angle ($\theta$) between the under layer pattern and the upper layer pattern are calculated from the image analysis to determine whether the overlay is right or wrong.

The inspection may be selectively performed in an on-line or off-line inspection, and it is also possible in the on-line inspection method to provide a feedback of an inspection result directly to a semiconductor manufacturing line as an electric signal or the like via a signal line. Further, it is also possible in the off-line inspection method that the inspection result is directly input from a terminal of the inspection apparatus to provide a feedback thereof to the semiconductor manufacturing line as an electric signal or the like via a signal line. The inspection result may be used for quality control in the course of manufacturing process via a communication with a host computer in the semiconductor manufacturing line.

With reference to FIG. 1, the description is now directed to an operation for loading the wafer W as before the inspection onto the stage unit 5 within the chamber 12 and unloading the wafer W as after the inspection from the stage unit.

A preparatory environment compartment 62 located adjacent to the chamber 12 of the sample surface inspection apparatus 1 is configured such that in the semiconductor manufacturing process, an environment associated with the wafer carried in from the outside is altered to an environment existing inside the chamber 12 where the stage unit 5 with the wafer holding table 51 is located, until the environment within the preparatory environment compartment 62 is in conformity with the environment inside the chamber 12 to allow the wafer as before the inspection to be carried in from the preparatory environment compartment 62 onto the wafer holding table.

Specifically, a gate valve 63 is disposed between the housing 11 and a housing 61. The housing 11 defines the chamber 12 containing the vibration isolating bed having a known vibration proofing structure, and the stage unit 5 having the wafer holding table 51. The stage unit 5 is disposed on the vibration isolating bed. The housing 61 defines the preparatory environment compartment 62. The chamber 12 and the preparatory environment compartment 62 can be selectively placed in communication with each other or blocked from each other, via the gate valve 53. In addition, another gate valve or flange may be arranged in order to introduce, into the preparatory environment compartment, the wafer in the chamber and the preparatory environment compartment 62. In this regard, when the wafer is transferred between the preparatory environment compartment 62 and the chamber 12 through the gate valve 63, the environments inside both of the chamber and the compartment are kept substantially equal (e.g., in a vacuum atmosphere at a degree of vacuum around $10^{-4}$ Pa to $10^{-6}$ Pa).

Since in the semiconductor manufacturing process, the wafer subject to the inspection before being transferred to a subsequent step is held in an environment suitable for a transfer to the subsequent step, the preparatory environment compartment is firstly controlled to achieve the environment for transferring the wafer to the subsequent step in a known manner by means of a gas supply unit (not shown) and a vacuum evacuation unit, both having a known structure. Once the environment for transferring the wafer to the subsequent step and the environment inside the preparatory environment compartment (vacuum condition) have become equal, the another valve or flange operable to introduce the wafer into the preparatory environment compartment is opened to allow the wafer to be introduced into the preparatory environment compartment 62, where the vacuum evacuation system or the gas supply unit as mentioned above is controlled to now achieve the same environment (vacuum condition) as the environment in which the wafer holding table 51 is located or inside the chamber 12.

After that, the gate valve 63 for isolating the chamber 12 from the preparatory environment compartment 62 is opened to allow the wafer W as before the inspection to be transferred onto the wafer holding table 51 (this step referred to as loading). After the transfer of the wafer as before the inspection having been completed, the gate valve 63 is closed, and the environment in which the wafer holding table is located is adjusted to be suitable for the inspection and then the inspection is started.

When the wafer having finished with the inspection is carried out of the wafer holding table 51 (the operation referred to as unloading) and transferred to the subsequent step, the operation may be carried out in an inverse order to the loading. In this regard, preferably the vacuum evacuation unit may be implemented by a combination of a turbo-molecular pump 66 with a dry-root pump 67 as shown in FIG. 1, but a rotary pump equipped with an oil mist trap or a molecular sieve may be used instead of the dry-root pump.

A configuration comprising a plurality (two in this case) of preparatory environment compartment 62 as shown in FIG. 3 is also applicable to the illustrated embodiment.

A certain level of irradiation of the electrons onto the surface is required in order to obtain a capacity contrast on the surface. To obtain this required irradiation amount (referred hereinafter to as a required Dose amount) of electron beam, the present invention is characterized in having an irradiation shape of the electron beam with a long beam length along a scanning direction of the stage relative to the pattern to be inspected.

The length of the beam is determined by the required Dose amount.

The required Dose amount may be controlled to achieve the best contract between an outer pattern and an inner pattern, and may be determined in dependence on the specific stage speed and the current density.

The geometry, material, sectional structure and the like of the surface of each specific wafer may be input, and the beam length may be determined from the input data and applied. In that case, Beam length $X_0 = Hz \cdot C_{wf} \cdot \Delta V / J_e$ where:

Hz: Operating frequency of TDI (stage speed)

$C_{wf}$: Electrostatic capacity of wafer surface determined in dependence on the sectional structure, surface material and the like of the wafer, which may be determined, as follows:

by way of example, assuming that a wafer having been applied with the resist by the resist thickness of "d", and the relative dielectric constant of the resist is denoted by $\in_r$ and the dielectric constant in vacuum is denoted by $\in_0$, then $C_{wf} = d / (\in_r \cdot \in_0)$ $\Delta V = V_{EO} - V_{RTD}$ $V_{EO}$: Drawing voltage of secondary electrons $V_{RTD}$: Substrate voltage or retarding voltage $J_e$: Irradiated current density to substrate.

Owing to the deflection (blanking) of the electron beam, the sample surface is subject to the irradiation of the electron beam having a slightly high density of distribution in the direction of the deflected electron beam. This may lead to a small bias in the charged condition over the sample surface. To address that, a correction of the Dose amount may be applied via the blanking. To do so, an amount of correction is calculated with the blanking direction aligned with the scanning direction, and a required Dose amount by "$X_0$" is determined. The blanking direction may be the stage scanning direction or the direction opposite the stage scanning direction.

Assuming that the term of correction for the $X_0$ via the blanking is denoted by "$X_B$", the blanking time by "$\tau_B$", and the distance for the beam to move on the substrate surface by "L", then $X_B = Hz \cdot L \cdot \tau_B$, and the beam length $X_0$ after the correction by the blanking will be given by $X_0 = Hz \cdot C_{wf} \cdot \Delta V / J_e \pm X_B$ (It is to be noted that the sign ± depends on the blanking direction, where the + designates the blanking direction opposite the heading direction of the stage. The sign − designates the blanking direction in conformity with the heading direction of the stage.)

Further, the correction for the required Dose amount by the blanking may be provided by the control to the substrate voltage or the retarding voltage for controlling the increment of the substrate surface potential.

In this case, the voltage adjustment $\Delta V_E$ will be given by $\Delta V_B = J_e \cdot \tau_B / C_{wf}$ In order to reduce the correction amount for the required Dose amount by blanking; the blanking direction may be set to be perpendicular to the heading direction of the stage.

Further, if there is no need for correction on the required Dose amount by blanking to be taken into account; the blanking direction may be in any desired directions.

The beam length may be changed for each specific wafer, or may be changed depending on the sectional structure of the specific pattern to be inspected or the specific material of the surface. For example, data on the beam length may be previously included in a recipe, so that when the wafer is loaded, the beam length may be determined to be suitable for that specific wafer or pattern to be inspected.

Figure 22:
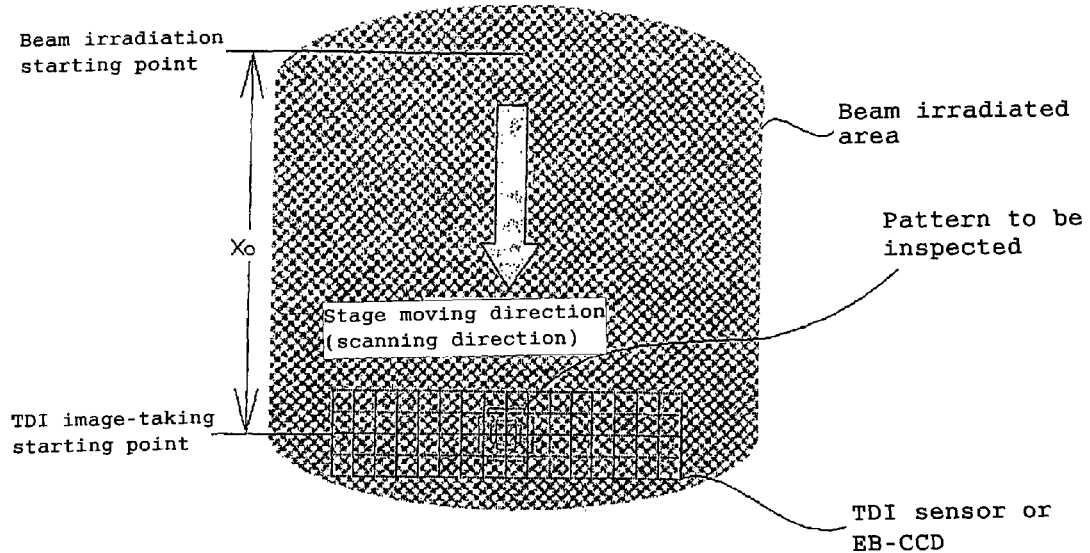
FIG. 22 depicts an irradiation size of an electron beam and an image-taking concept.

FIG. 22 shows a physical relationship between the irradiated electron beam and the pattern to be inspected. In FIG. 22, the region indicated with the cross-hatching represents the irradiation area by the electron beam and the size of the area. Although in the illustrated example, the irradiation area assumes a geometry with arched upper and lower edges and straight left and right edges, the area may have a rectangular shape or an elliptic shape that is elongated along the moving direction of the stage. As the beam starts to irradiate the pattern to be inspected and at the time when the pattern to be inspected has moved by $X_0$, the pattern to be inspected can pass across and under the TDI sensor. Using this timing, the TDI sensor starts importing of the image. In this way, the beam irradiation begins at the position by the distance $X_0$ away from the location of the TDI sensor, and the required Dose amount for the image-taking would be given to the pattern to be inspected during the stage being moved by the distance $X_0$.

Figure 23:
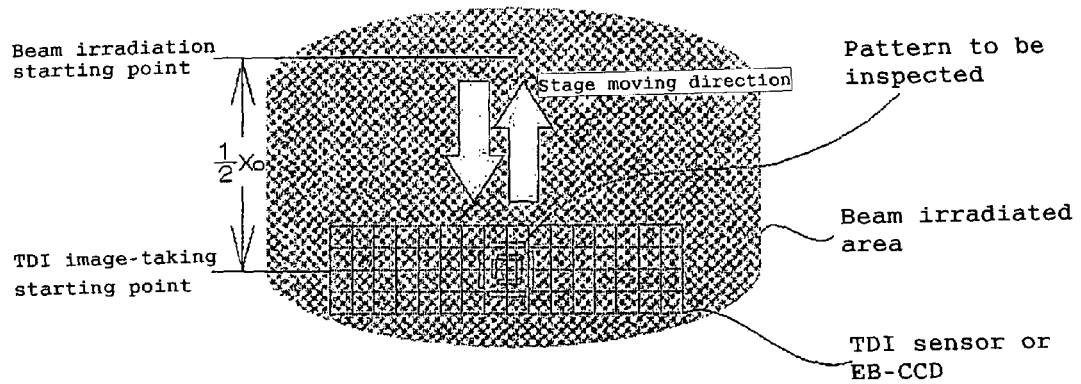
FIG. 23 depicts an irradiation size of an electron beam and an image-taking concept when a stage is driven to make a turning motion.

FIG. 23 shows another irradiation example. Depending on the arrangement of the pattern to be inspected, the $X_0$ may be set to be a half of that calculated from the required Dose amount, and in that case the stage may be moved in a turn-back manner. In the illustrated example, the region indicated with the cross-hatching represents the irradiation area by the electron beam and the size of the area.

The beam irradiation begins at the position by $(½)/·X_0$ away from the location of the TDI sensor, the stage turns back after having moved by $(½)/·X_0$, and the stage again moves by $(½)/·X_0$, where the image-taking is executed by the TDI sensor. This allows the Dose amount equal to that given by the $X_0$ movement to be provided to the pattern to be inspected.

In this approach, if the pattern to be inspected subsequently to the pattern to be inspected first is located downstream to the first pattern, or located at a position opposite to the moving direction of the stage required for the first inspection, then the distance for the stage to travel should be cut by half, contributing to time saving.

The field of view for image-taking comprises a pixel number of the TDI, 512 pix in the X direction (identical to the scanning direction of the stage in the illustrated example) and 2048 pix in the Y direction, in which data integration by 512 pix is configured, while the stage providing the X-directional scanning.

The beam is configured to be elongated toward the upstream side along the X direction of the field of view, and the region where the TDI imports the image has been already given the required Dose amount by this elongated electron beam thereby allowing the TDI to obtain the image of the pattern to be inspected.

In this stage, the Y-directional dimension (beam width) of the irradiated beam may be any dimension (width) as desired depending on the dimension of the pattern to be inspected. If the larger pattern is inspected by using a low magnification factor, the beam width may be sized larger than the Y-directional pixel size (e.g., 2048 pix) of the TDI, while on the other hand, if the smaller pattern is inspected by using a high magnification factor, the beam width may be sized smaller than the Y-directional pixel size (e.g., 2048 pix) of the TDI.

Determining the beam diameter as described above can provide a more efficient image-taking of the overlay marks and patterns, especially for an arrangement of the overlay marks or patterns that are aligned side by side in a certain direction. Specifically, the pattern subject to image-taking is applied with the irradiation of the primary electron since before the timing for image-taking (this scanning referred to as Pre-Dose), so that the pattern subject to image-taking should have been charged sufficiently at the time of taking an image of the pattern. If the patterns subject to image-taking are disposed serially along a certain direction, and if the beam diameter is determined in association with the moving of the stage as in the present invention, then each of the patterns subject to image-taking would be ready as they have been charged equally for image-taking. Specifically, if the image-taking is carried out simply by taking the distance between patterns subject to image-taking and the stage speed into account, while moving the stage at a constant speed, an image of the pattern subject to image-taking that would have been held in an optimal charged condition can be taken successfully without the need to stop the stage each time at the location of the pattern subject to image-taking and stay there until the pattern subject to image-taking is charged to a constant charge amount, as is the case with the stop-and-repeat approach.

Figure 24:
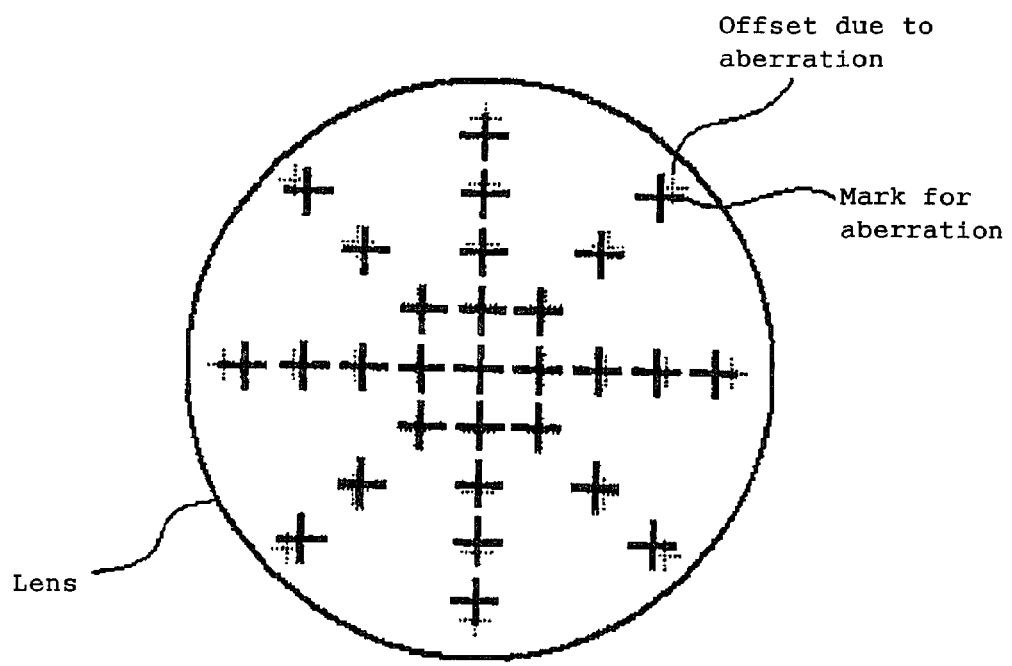
FIG. 24 shows an example of a pattern distribution for investing in lens aberration research.

Referring now to FIG. 24, there is shown an example for measuring a distribution of lens aberration of an exposure unit with an inspection apparatus using an electron beam.

FIG. 24 shows an example of a pattern distribution for lens aberration research.

A set of isolated pattern is used as the pattern for research, and a required number of patterns for lens aberration research is lined up at a space as required therebetween. The set of patterns is transferred onto a sample surface by the exposure unit, and any offset of that set of patterns is examined to study the distribution of the lens aberration.

In the illustrated example, the electron beam was irradiated onto the pattern over a large area, and the image is taken serially with the TDI or the EB-TDI, while providing a scanning operation by the stage or the beam.

Since the overlay mark in the layers of a product is not applied to every one of the chips, therefore the image is taken by repeating the process of step-and-repeat, while moving to the pattern section required to take a stationary image by the CCD or the EB-CCD using the electron beam having a larger area to irradiate the pattern. In that case, the image may be taken in the Still-mode of the TDI or the EB-TDI. Further, only the pattern section may be scanned for taking an image.

The invention claimed is:

1. A method for inspecting a sample surface by using sample surface inspection apparatus, in which an electron beam generated by an electron gun of the sample surface inspection apparatus is irradiated onto the sample surface, and secondary electrons emanating from the sample surface are formed into an image toward an electron detection plane of a detector for inspecting the sample surface, the method characterized in that a condition for forming the secondary electrons into an image on the detection plane of the detector is controlled such that a potential in the sample surface varies in dependence on an amount of the electron beam irradiated onto the sample surface, a method for controlling the condition for forming the secondary electrons into an image is provided by modifying a sample voltage or a retarding voltage in dependence on an amount of the electron beam irradiated onto the sample surface, and the variation of the potential in the sample surface is computed in consideration of a blanking for preventing the electron beam from being irradiated onto the sample surface.

2. The method for inspecting a sample surface in accordance with claim 1, characterized in that the detector is an EB-CCD.

3. The method for inspecting a sample surface in accordance with claim 1, characterized in that the detector is a TDI-CCD, and a direction for deflecting the electron beam is either in the heading direction of a stage holding the sample, or the opposite direction to the heading direction, wherein a beam irradiation begins at a position by a distance $X_0$ away from the location of the TDI-CCD sensor, and a required Dose amount for an image-taking is given to a pattern to be inspected during the stage being moved by the distance $X_0$.

4. The method for inspecting a sample surface in accordance with claim 1, characterized in that the detector is a TDI-CCD, and a direction for deflecting the electron beam is either in the heading direction of a stage holding the sample, or the opposite direction to the heading direction, wherein a beam irradiation begins at the position by $(½)/X_0$ away from the location of the TDI-CCD sensor, the stage turns back after having moved by $(½)/X_0$, and the stage again moves by $(½)/X_0$, where an image-taking is executed by the TDI-CCD sensor.

5. The method for inspecting a sample surface in accordance with claim 1, characterized in that a Dose amount representing an amount of irradiated charges as per a unit area over the sample surface is calculated from the blanking and a current density on the sample surface.

6. The method for inspecting a sample surface in accordance with claim 1, characterized in that the sample voltage is determined by summing up an originally applied sample voltage and a voltage applied through the irradiation of the electron beam to the sample.

7. A sample surface inspection apparatus, comprising: an electron gun for generating an electron beam to be irradiated onto a sample surface; a primary optical system for guiding the electron beam onto the sample surface; a detector for detecting secondary electrons emanating from the sample surface; and a secondary optical system for guiding the secondary electrons onto the detector, the apparatus characterized in further comprising a voltage adjustment mechanism for modifying a potential in the sample surface in dependence on an amount of the electron beam, wherein the voltage adjustment mechanism has a means for modifying a sample voltage or a retarding voltage in dependence on an amount of the electron beam irradiated onto the sample surface, and the variation of the potential in the sample surface is computed in consideration of a blanking for preventing the electron beam from being irradiated onto the sample surface.

8. The surface inspection apparatus in accordance with claim 7, characterized in that the detector is an EB-CCD.

9. The sample surface inspection apparatus in accordance with claim 7 characterized in that the detector is a TDI-CCD, and a direction for deflecting the electron beam is either in the heading direction of a stage holding the sample, or the opposite direction to the heading direction, wherein a beam irradiation begins at a position by a distance $X_0$ away from the location of the TDI-CCD sensor, and a required Dose amount for an image-taking is given to a pattern to be inspected during the stage being moved by the distance $X_0$.

10. The sample surface inspection apparatus in accordance with claim 7 characterized in that the detector is a TDI-CCD, and a direction for deflecting the electron beam is either in the heading direction of a stage holding the sample, or the opposite direction to the heading direction, wherein a beam irradiation begins at the position by $(½)/X_0$ away from the location of the TDI-CCD sensor, the stage turns back after having moved by $(½)/X_0$, and the stage again moves by $(½)/X_0$, where an image-taking is executed by the TDI-CCD sensor.

11. The sample surface inspection apparatus in accordance with claim 7, characterized in that a Dose amount representing an amount of irradiated charges as per a unit area over the sample surface is calculated from the blanking and a current density on the sample surface.

12. The sample surface inspection apparatus in accordance with claim 7, characterized in that the sample voltage is determined by summing up an originally applied sample voltage and a voltage applied through the irradiation of the electron beam to the sample surface.

\* \* \* \* \*